US006563147B1

(12) United States Patent
Ikeda

(10) Patent No.: US 6,563,147 B1
(45) Date of Patent: May 13, 2003

(54) HBT WITH A SIGE BASE REGION HAVING A PREDETERMINED GE CONTENT PROFILE

(75) Inventor: Tatsuhiko Ikeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/717,214

(22) Filed: Nov. 22, 2000

(30) Foreign Application Priority Data

| Jan. 11, 2000 | (JP) | ................................. 2000-002429 |
| Jun. 19, 2000 | (JP) | ................................. 2000-182809 |

(51) Int. Cl.$^7$ .......................................... H01L 21/331
(52) U.S. Cl. ..................... 257/197; 257/592; 257/593
(58) Field of Search ..................... 257/191, 197–198, 257/575–576, 587–588, 592, 593, 616

(56) References Cited

U.S. PATENT DOCUMENTS

| 6,265,275 B1 | * | 7/2001 | Marty et al. | ................. 438/309 |
| 6,287,930 B1 | * | 9/2001 | Park | ............................. 438/369 |

FOREIGN PATENT DOCUMENTS

| JP | 6-77245 | 3/1994 |
| JP | 7-75236 | 8/1995 |
| JP | 10223537 A | * 8/1998 |

OTHER PUBLICATIONS

"Si/SiGe Epitaxial–Base Transistors–Part I: Materials, Physics, and Circuits", D.L. Harame et al., IEEE Transactions on Electron Devices, vol. 42, No. 3, Mar. 1995, pp. 455–468.

"SiGe HBT Technology: A New Contender for Si–Based RF and Microwave Circuit Applications", J.D. Cressler, IEEE Transactions on Microwave Theory and Techniques, vol. 46, No. 5, May 1998, pp. 572–589.

"Si/SiGe Epitaxial–Base Transistors–Part II: Process Integration and Analog Applications", D.L. Harame et al., IEEE Transactions on Electron Devices, vol. 42, No. 3, Mar. 1995, pp. 469–482.

"High speed SiGe heterobipolar transistors", A. Schüppen et al., Journal of Crystal Growth, 157, (1995), pp. 207–214.

"A 11.7 GHz 1/8–Divider using 43 GHz Si High Speed Bipolar Transistor with Photoepitaxially Grown Ultra–Thin Base", T. Yamazaki et al., IEDM90 Technical Digest, pp. 309–312.

"A high performance low complexity SiGe HBT for BiCMOS integration", A. Chantre et al., IEEE BCTM 5.2, 1998, pp. 93–96.

* cited by examiner

*Primary Examiner*—Minh Loan Tran
*Assistant Examiner*—Thomas L Dickey
(74) *Attorney, Agent, or Firm*—McDermott, Will & Emery

(57) ABSTRACT

A method of manufacturing a hetero-junction bipolar transistor (HBT) which is suitable for high frequency operation. In the method, a first conductive layer and a first insulation layer are formed on a semiconductor substrate in an overlapping manner. A first mask is patterned on the first insulation layer. An impurity of a first conductive type is implanted into the first insulating layer using the first mask. The first mask is scaled down before a second mask is formed so as to cover the entire surface of the first insulating layer, with exception of an area covered by the scaled-down first mask. After elimination of the first mask, an opening is formed in the first insulating layer, by means of removal of the area coated with the scaled down first mask. An impurity of second conductivity type is introduced into an exposed portion of the first conductive layer within the opening.

5 Claims, 23 Drawing Sheets

HBT WITH A SIGE BASE REGION HAVING A PREDETERMINED GE CONTENT PROFILE

BACKGROUND OF THE INVENTION

1. Field of the Invention

The present invention relates to a bipolar transistor and a manufacturing method thereof, and more particularly, to a bipolar transistor suitable for high-frequency operation and a manufacturing method for manufacturing such a transistor.

2. Description of the Background Art

FIG. 13 is a cross-sectional view showing a conventional bipolar transistor manufactured so as to be able to operate at a given high frequency. The bipolar transistor shown in FIG. 13 is provided with a silicon substrate 10 made up from a p$^-$-type semiconductor. An n$^+$-type diffusion layer 12 made up from an n$^+$-type semiconductor and a p-type diffusion layer 14 made up from an p-type semiconductor are formed within the silicon substrate 10. Further, an n-type silicon layer 16 made up from an n-type semiconductor is laid on the n$^+$-type diffusion layer 12 and the p-type diffusion layer 14. A field oxide film 17 for separating individual active regions of the transistor from one another is laid on the surface of the n-type silicon layer 16.

An n$^+$-type collector lead layer 18 of an n$^+$-type semiconductor and an element isolation p-type diffusion layer 20 of a p-type semiconductor are formed within the n-type silicon layer 16. The n$^+$-type collector lead layer 18 is formed in the areas of the n$^-$-type silicon layer 16 that are not covered with the field oxide film 17, and the surface of the n$^+$-collector lead layer 18 is covered with a thin oxide film 19. The element isolation p-type diffusion layer 20 is formed on the p-type diffusion layer 14.

A base diffusion layer 22 made up from a p-type semiconductor is formed in an active region of the n$^-$-type silicon layer 16. An emitter diffusion layer 24 made up from an n-type semiconductor is formed in the vicinity of the center of the base diffusion layer 22. A base lead electrode 26 is formed from doped polysilicon on the base diffusion layer 22 so as not to conduct with the emitter diffusion layer 24. An emitter electrode 28 is formed from doped polysilicon on the emitter diffusion layer 24. An oxide film 30 is interposed between the base lead electrode 26 and the emitter electrode 28 for isolating them from each other.

The entire surface of the bipolar transistor is coated with an insulating film 32. In the insulating film 32, there are formed a contact hole communicating with the n$^+$-type collector lead layer 18, a contact hole communicating with the emitter electrode 28, and a contact hole communicating with the base lead electrode 26. A metal interconnection 40 is connected to the n$^+$-type collector lead layer 18 by way of a plug 34 formed in the corresponding contact hole; a metal interconnection 42 is connected to the emitter electrode 28 by way of a plug 36 formed in the corresponding contact hole; and a metal interconnection 44 is connected to the base lead electrode 26 by way of a plug 38 formed in the corresponding contact hole.

In order to cause the bipolar transistor to operate at a high frequency, it is better to make base-to-collector capacitance low. The parasitic capacitance becomes greater as the boundary area between the base diffusion layer 22 and the n$^-$-type silicon layer 16 becomes larger. Accordingly, it is desirable to make the boundary area small in order to cause the transistor to operate at high frequency.

The structure shown in FIG. 13 is also called a double polysilicon self-aligned structure. The double polysilicon self-aligned structure comprises base lead electrode 26, and the emitter electrode 28 formed inside the base lead electrode 26 in a self-aligned manner. This structure brings the emitter electrode 28 and the base lead electrode 26 in very close proximity to each other while preventing a short circuit from arising therebetween. The structure shown in FIG. 13 makes the boundary area between the base diffusion layer 22 and the n$^-$-type silicon layer 16 sufficiently small, thereby diminishing the base-to-collector parasitic capacitance.

Further, the structure shown in FIG. 13 renders a distance between the emitter diffusion layer 24 and the base lead electrode 26 sufficiently small, thereby diminishing the resistance of the base region to a sufficiently small value. As has been mentioned, the structure shown in FIG. 13 is suitable for causing the bipolar transistor to operate at high frequency.

However, the limit of the cut-off frequency that can be attained by the structure shown in FIG. 13 is said to be in the range of 30 to 40 GHz. The structure shown in FIG. 13 does not enable realization of a transistor having a greatly superior high-frequency characteristic.

Shortening a time required for carriers to run through the base region by means of reducing the width of the base region (i.e., by reducing the thickness of the base diffusion layer 24 shown in FIG. 13) is effective for increasing the operation speed of the bipolar transistor. However, if the width of the base region is reduced, punch-through becomes likely to arise in the transistor.

Increasing the impurity content of a base diffusion layer makes punch through unlikely to arise in a bipolar transistor. However, the current gain of the bipolar transistor drops as the impurity content of the base diffusion layer becomes high. For this reason, a practical bipolar transistor cannot be realized by means of increasing simply the impurity content of the base diffusion layer.

A technology for constituting a bipolar transistor through use of a hetero-junction has already been known as a technique for solving the above-described drawback of the conventional bipolar transistor. Such a hetero-junction bipolar transistor (HBT) is described in, for example, IEEE TRANSACTIONS ON ELECTRON DEVICES Vol. 42, No. 3 (1995), pp. 455 to 482. However, all HBTs that have already been proposed require very complicated manufacturing processes and are unsuitable for mass production.

SUMMARY OF THE INVENTION

The present invention has been conceived to solve the foregoing drawbacks of the background art and is aimed at providing a bipolar transistor which can be readily fabricated through simple processes, as well as a corresponding manufacturing method.

The present invention is also aimed at providing a method of readily and accurately manufacturing a base lead electrode and an emitter diffusion layer by means of the self-alignment technique.

The present invention has been conceived to solve the drawback set forth and is aimed at providing an HBT that can be readily manufactured through simple processes.

Further, the present invention is aimed at providing a method that enables simple manufacture of an HBT.

The above objects of the present invention are achieved by a bipolar transistor described below. The transistor includes a first-type silicon layer provided on the surface of a silicon substrate so as to contain impurities of first conductivity type. A first-type silicon epitaxial layer is provided on the first-type silicon layer so as to contain impurities of first conductivity type. A second-type SiGe epitaxial layer which contains impurities of second conductivity type at a first concentration is provided on the first-type silicon epitaxial layer so as to contain germanium at a predetermined concentration profile. A second-type silicon epitaxial layer is provided on the second-type SiGe epitaxial layer so as to contain impurities of second conductivity type at a second concentration lower than the first concentration. The germanium content in the second-type SiGe epitaxial layer becomes higher in the vicinity of a boundary region between the second-type SiGe epitaxial layer and the first-type silicon epitaxial layer than in a boundary region between the second-type SiGe epitaxial layer and the second-type silicon epitaxial layer.

The above objects of the present invention are achieved by a method of manufacturing a bipolar transistor described below. In the manufacturing method, on the surface of a silicon substrate is formed a first-type silicon layer containing impurities of first conductivity type. A first-type silicon epitaxial layer is formed on the first-type silicon layer so as to contain impurities of first conductivity type. A second-type SiGe epitaxial layer is formed on the first-type silicon epitaxial layer so as to contain impurities of second conductivity type at a first concentration and germanium at a predetermined concentration profile. A second-type silicon epitaxial layer is formed on the second-type SiGe epitaxial layer so as to contain impurities of second conductivity type at a second concentration lower than the first concentration. The germanium content in the second-type SiGe epitaxial layer is higher in the vicinity of a boundary region between the second-type SiGe epitaxial layer and the first-type silicon epitaxial layer than in a boundary region between the second-type silicon epitaxial layer and the second-type SiGe epitaxial layer. An oxide film is formed on the second-type silicon epitaxial layer so as to have an opening at predetermined positions. An emitter electrode containing impurities of first conductivity type is formed from polycrystalline or amorphous silicon so as to come into contact with the second-type silicon epitaxial layer by way of the opening. Impurities of second conductivity type are implanted into the portion of the three layered epitaxial layers which portions are not covered with the emitter electrode. The three layered epitaxial layers are patterned into the form of base lead electrodes. A wafer is subjected to heat treatment. As a result, the impurities of first conductivity type contained in the emitter electrode are defused into the second-type silicon epitaxial layer, to thereby form a emitter layer adjusted to a semiconductor of first conductivity type. Further, as a result of the heat treatment, the impurities of second conductivity type implanted in the three layered epitaxial layers are activated to thereby form base lead electrodes.

The above objects of the present invention are achieved by a method of manufacturing a bipolar transistor described below. In the method, a first conductive layer and a first insulation layer are formed on a semiconductor substrate in an overlapping manner. A first mask is patterned on the first insulation layer. An impurity of a first conductive type is implanted into the second type of silicon layer, the second type SiGe layer and first type silicon layer through the first insulating layer using the first mask. The first mask is scaled down. A second mask is formed so as to cover the entire surface of the first insulating layer, with exception of an area covered by the scaled-down first mask. The first mask is eliminated. An opening is formed in the first insulating layer, by means of removal of the area coated with the first mask. An impurity of a first conductive type is introduced into an exposed portion of the second conductive layer within the opening.

The other objects and further features of the present invention will be apparent from the following detailed description when read in conjunction with the accompanying drawings.

DESCRIPTION OF THE PREFERRED EMBODIMENTS

Figure 1A:
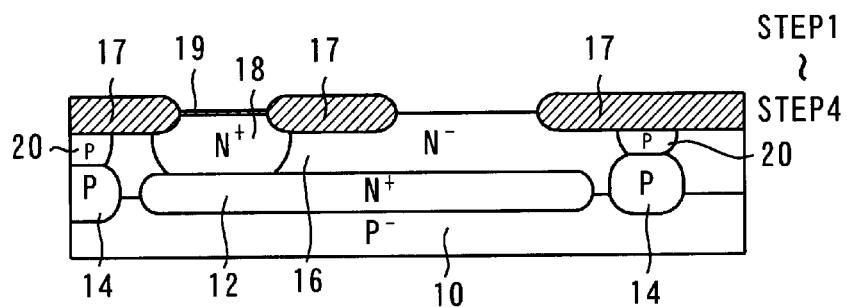
FIGS. 1A to 1D and FIGS. 2A to 2D are cross-sectional views for describing a method of manufacturing an HBT according to a first embodiment of the present invention.

In the following, principles and embodiments of the present invention will be described with reference to the accompanying drawings. The members and steps that are common to some of the drawings are given the same reference numerals and redundant descriptions therefor may be omitted.

First Embodiment

Figure 1B:
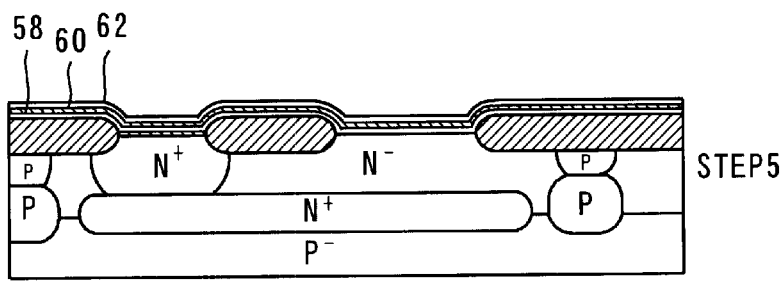
Figure 1C:
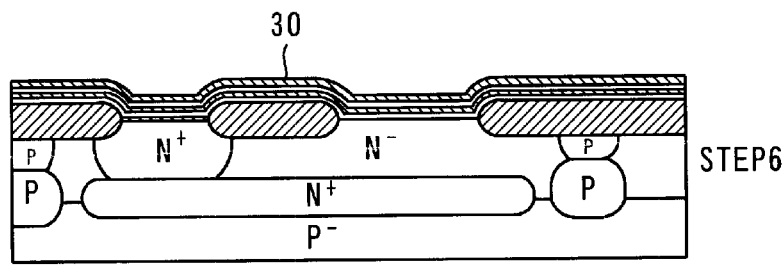
Figure 1D:
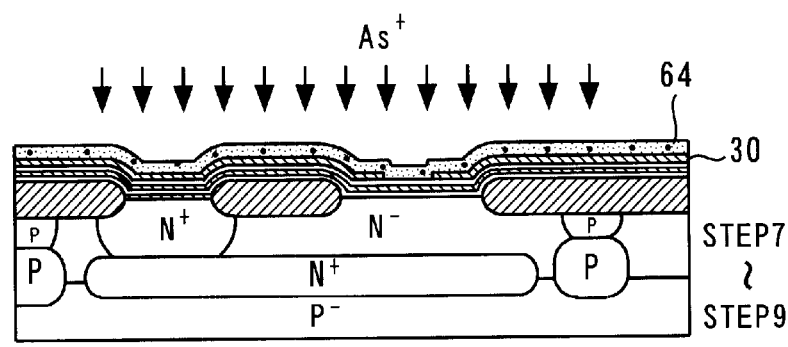
Figure 2A:
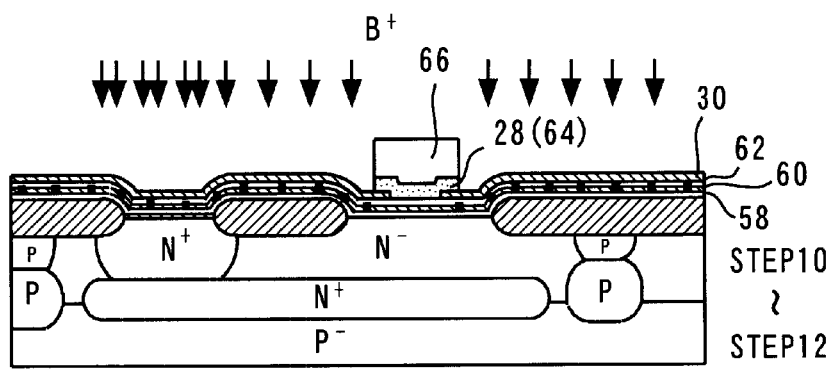
Figure 2B:
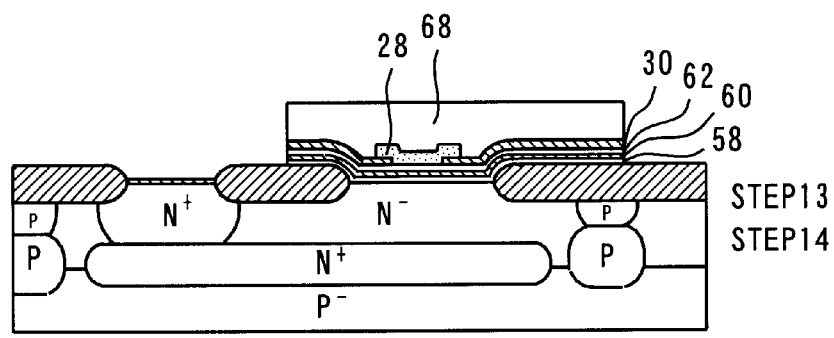
Figure 2C:
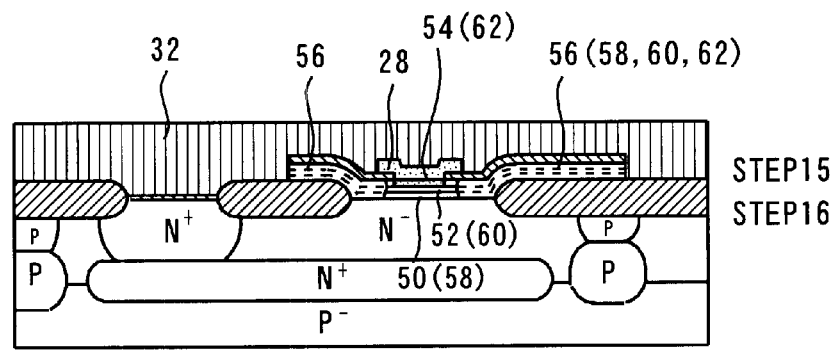
Figure 2D:
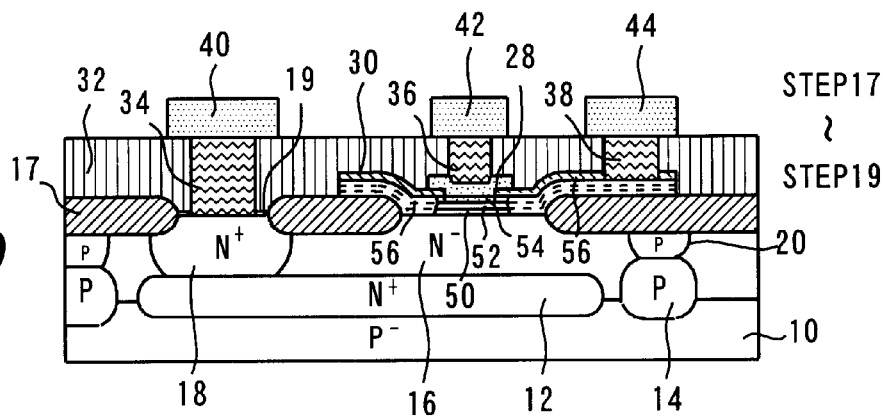

FIGS. 1A through 2D are cross-sectional views for describing a method of manufacturing an HBT according to a first embodiment of the present invention. Particularly, FIG. 2D shows a characteristic structure of the HBT of the first embodiment.

As shown in FIG. 2D, the HBT of the present embodiment is provided with a silicon substrate 10 adjusted to a p⁻-type semiconductor. An n⁺-type diffusion layer 12 made up from an n⁻-type semiconductor and a p-type diffusion layer 14 made up from a p-type semiconductor are formed within the silicon substrate 10. Further, an n-type silicon layer 16 adjusted to an n⁻-type semiconductor is laid on the n⁺-type diffusion layer 12 and the p-type diffusion layer 14. A field oxide film 17 for separating individual active regions of the transistor from one another is laid on the surface of the n-type silicon layer 16.

An n⁺-type collector lead layer 18 made up from an n⁻-type semiconductor and an element isolation p-type diffusion layer 20 made up from an p-type semiconductor are formed within the n-type silicon layer 16. The n⁺-type collector lead layer 18 is formed in the areas of the n⁻-type silicon layer 16 that are not covered with the field oxide film 17, and the surface of the n⁺-collector lead layer 18 is covered with a thin oxide film 19. The element isolation p-type diffusion layer 20 is formed on the p-type diffusion layer 14.

A sub-collector layer 50, a base layer 52, and an emitter layer 54 are formed in the active region of the n⁻-type silicon layer 16 through an epitaxial growth method. The sub-collector layer 50 and the emitter layer 54 correspond to an n-type semiconductor, and the base layer 52 corresponds to a SiGe film adjusted to a p-type semiconductor.

On the n⁻-type silicon layer 16 base lead electrode 56 made up from a p-type semiconductor is formed around the base layer 52. Further, an emitter electrode 28 is formed from doped polysilicon on the emitter layer 54. An oxide film 30 is interposed between the base lead electrode 56 and the emitter electrode 28 in order to insulate them from each other.

The entire surface of the HBT is covered with an insulating film 32. In the insulating film 32, there are formed a contact hole opening to the n⁺-type collector lead layer 18, a contact hole opening to the emitter electrode 28, and a contact hole opening to the base lead electrode 56. A metal interconnection 40 is connected to the n⁺-type collector lead layer 18 by way of a plug 34 formed in the corresponding contact hole; a metal interconnection 42 is connected to the emitter electrode 28 by way of a plug 36 formed in the corresponding contact hole; and a metal interconnection 44 is connected to the base lead electrode 56 by way of a plug 38 formed in the corresponding contact hole.

Next will be described a method of manufacturing the HBT of the first embodiment.

In an HBT manufacturing procedure according to the present embodiment, the HBT is manufactured to a certain state, as shown in FIG. 1A, by means of a known technique.

First, the n⁺-type diffusion layer 12 and the p-type diffusion layer 14 are formed on the silicon substrate 10 (which is adjusted to a p⁻-type semiconductor) (step 1).

The n⁻-type silicon layer 16 is formed on the silicon substrate 10, the n⁺-type diffusion layer 12, and the p-type diffusion layer 14 (step 2).

After formation of the field oxide film 17, the n⁺-type collector lead layer 18 and the element isolation p-type diffusion layer 20 are formed (step 3).

An oxide film 19 is formed on exposed silicon areas to a predetermined thickness. The oxide film 19 is removed from the surface of a wafer except in the area located above the n⁺-type collector lead layer 18; specifically, the oxide film 19 covering the areas where the base layer 52 and the base lead electrodes 56 are to be formed is removed (step 4).

As shown in FIG. 1B, a silicon epitaxial layer 58, a SiGe epitaxial layer 60, and a silicon epitaxial layer 62 are formed successively over the entire surface of the wafer (step 5). At this time, over the field oxide film 17 are formed a silicon film and a SiGe film as a polycrystalline film.

The silicon epitaxial layer 58 is to become a collector region of the HBT; the SiGe epitaxial layer 60 is to become a base region of the HBT; and the silicon epitaxial layer 62 is to become an emitter region.

Figure 3:
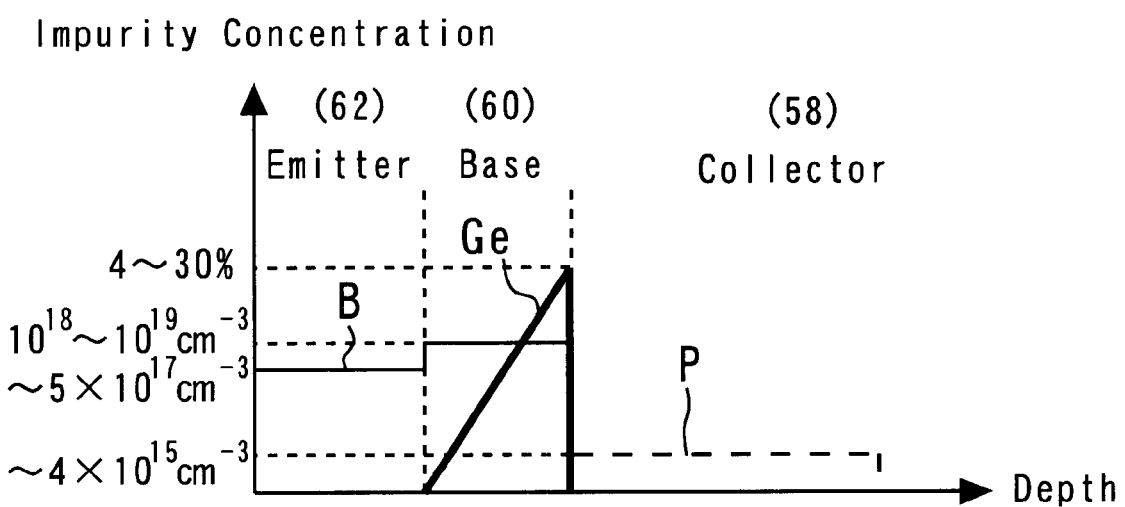
FIG. 3 shows a profile about the concentration of impurities and Ge incorporated to the three epitaxial layers included in the HBT according to the first embodiment of the present invention.

FIG. 3 shows a profile about the concentration of impurities and Ge incorporated to the three epitaxial layers 58, 60, and 62. As shown in FIG. 3, in the present embodiment, the silicon epitaxial layer 58 which is to become a collector region is doped with P (phosphorous) at a concentration of $4 \times 10^{15}$ cm⁻³ or thereabouts. Further, the SiGe epitaxial layer 60 which is to become a base region is doped with B (boron) at a concentration of $1 \times 10^{18}$ to $10^{19}$ cm⁻³ or thereabouts, and the silicon epitaxial layer 62 which is to become an emitter region is doped with B at a concentration of $5 \times 10^{17}$ cm⁻³ or thereabouts. The Ge content of the SiGe epitaxial layer 60 reaches a maximum of 4 to 30% in the boundary region between the SiGe epitaxial layer 60 and the silicon epitaxial layer 58. The Ge content is controlled so as to assume a profile that gradually decreases from the collector region side toward the emitter region side.

As shown in FIG. 1C, the oxide film 30 is deposited on the silicon epitaxial layer 62 (step 6).

As shown in FIG. 1D, an opening is formed in the area of the oxide film 30 where the emitter electrode 28 is to be formed (step 7).

Next, a polycrystalline silicon film 64 is deposited over the entire surface of the wafer (step 8).

The polycrystalline silicon film 64 is implanted with n-type impurities; e.g., As (arsenic) (step 9).

As shown in FIG. 2A, a photoresist film 66 is formed on the polycrystalline silicon film 64 for forming the emitter electrode 28 (step 10).

The polycrystalline film 64 is etched while the photoresist film 66 is used as a mask, to thereby form the emitter electrode 28 (step 11).

In order to implant impurities into the three epitaxial layers 58, 60, and 62, boron (B) is implanted through the oxide film 30 at a predetermined energy while the photoresist film 66 is used as a mask (step 12).

As shown in FIG. 2B, a photoresist film 68 is formed on the oxide film 30 for forming the base lead electrodes 56 while the emitter electrode 28 is protected (step 13).

The three epitaxial layers 58, 60, and 62 are etched together with the oxide film 30 while the photoresist film 68 is used as a mask, whereby the oxide film 30 and the epitaxial layers 58, 60, and 62 are patterned into the geometry of the base lead electrode 56 (step 14).

As shown in FIG. 2C, after removal of the photoresist film 68, the insulating film 32 is deposited over the entire surface of the wafer (step 15).

The entirety of the wafer is then subjected to heat treatment at a predetermined temperature (step 16).

During the course of the heat treatment, As contained in the emitter electrode 28 (corresponding to an As-doped polycrystalline silicon) is diffused into the silicon epitaxial layer 62. thereby forming the emitter layer 54 possessing the characteristic of an n-type semiconductor.

During the course of the heat treatment, the impurities (B) implanted into the portions of the three epitaxial layers 58, 60, and 62, which are not covered with the emitter electrode 28 are diffused and become active, thereby forming the base lead electrodes 56 possessing the characteristic of a p-type semiconductor.

The thus-described round of processing operations is followed by formation of contact holes at appropriate positions on the insulating film 32 (step 17).

The plugs 34, 36, and 38 are formed in the respective contact holes (step 18).

The metal interconnection 40 is formed on the insulating film 32 so as to communicate with the plug 34; the metal interconnection 42 is formed so as to communicate with the plug 36; and the metal interconnection 44 is formed so as to communicate with the plug 38, thus embodying the structure shown in FIG. 2D (step 19).

In the HBT of the present embodiment, a p-n junction is formed in the boundary region between the base layer 52 (of p-type) and the sub-collector layer 50 (of n-type) and in the boundary region between the base lead electrodes 56 (of p-type) and the n⁻-type silicon layer 16. In order to reduce base-to-collector parasitic capacitance and enable the HBT to operate at high frequency, the area of the p-n junction is desirably made small.

Figure 13:
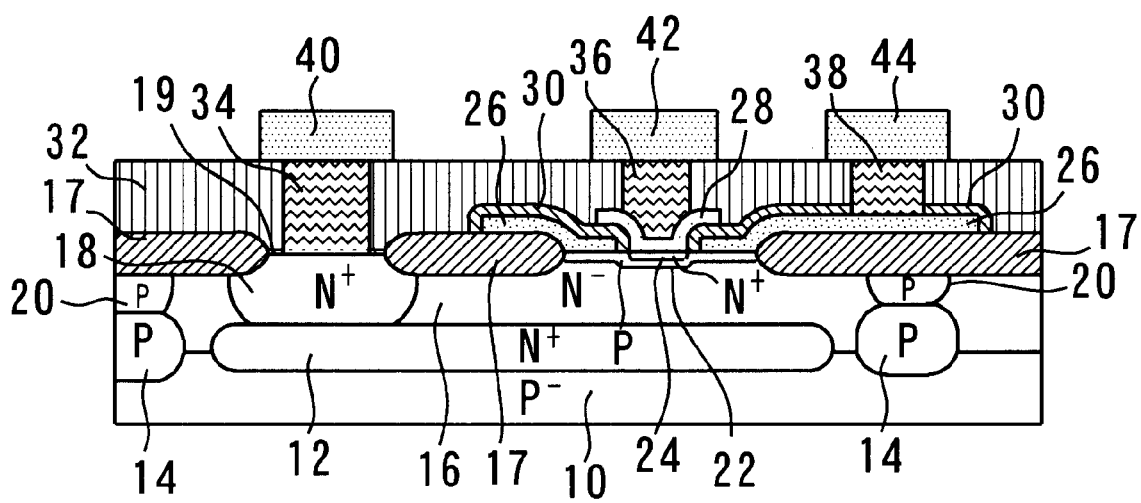
FIG. 13 is a cross-sectional view of a conventional transistor manufactured so as to able to operate at a given high frequency.

In the present embodiment, the emitter electrode 28 of the HBT is formed inside the base lead electrode 56 in a self-aligned manner. In the HBT having such a structure, the emitter electrode 28 and the base lead electrode 56 can be brought in much close proximity to each other while occurrence of a short circuit therebetween is prevented. More specifically, the structure of the HBT enables a sufficient reduction in the area of the p-n junction in the base-collector region while occurrence of a short circuit between the emitter region and the base region is prevented. Accordingly, the structure of the HBT of the present embodiment can reduce the base-to-collector parasitic capacitance, as in the case of the conventional double polysilicon self-aligned structure (see FIG. 13).

In the present embodiment, the width of the base region of the HBT is made sufficiently smaller than that of the base region of the conventional double polysilicon self-aligned structure. Further, in the present embodiment, the base layer 52 is made of a SiGe film, and the emitter layer 54 is made of a silicon film, whereby the forbidden band of the emitter layer 54 is made sufficiently wider than that of the base layer 52. In this case, even if the impurity content of the base layer 52 is increased, occurrence of a base current can be decreased, thereby ensuring a practically sufficient current gain. Thus, the HBT structure of the present embodiment enables an increase in the impurity content of the base layer 52 without impairment of a practical current gain, thereby preventing occurrence of punch-through. In other words, the HBT structure of the present embodiment ensures the same current gain as that achieved by the conventional HBT, effectively prevents occurrence of punch-through, and shortens the time required for carriers to run through the base region, thereby improving the high-frequency characteristic of the HBT.

As mentioned above, the HBT of the present embodiment can be manufactured through very simple processes and realize an excellent high-frequency characteristic without involvement of occurrence of punch-through.

Second Embodiment

Next will be described a method of manufacturing an HBT according to a second embodiment of the present invention, as well as the structure of the HBT. FIGS. 4A to 4D and FIGS. 5A and 5B are cross-sectional views for describing a method of manufacturing an HBT of the present embodiment. Particularly, FIG. 5B shows the characteristic structure of the HBT of the present embodiment.

As shown in FIG. 5B, the oxide film 30 covering the base lead electrodes 56 still remains around the n⁺-type collector lead layer 18, and a collector electrode 70 made of doped polysilicon is formed on the n⁺-type collector lead layer 18. With the exception of these two points, the HBT of the present embodiment is identical in structure with that employed in the first embodiment.

A method of manufacturing the HBT of the second embodiment will be described hereinbelow.

Figure 4A:
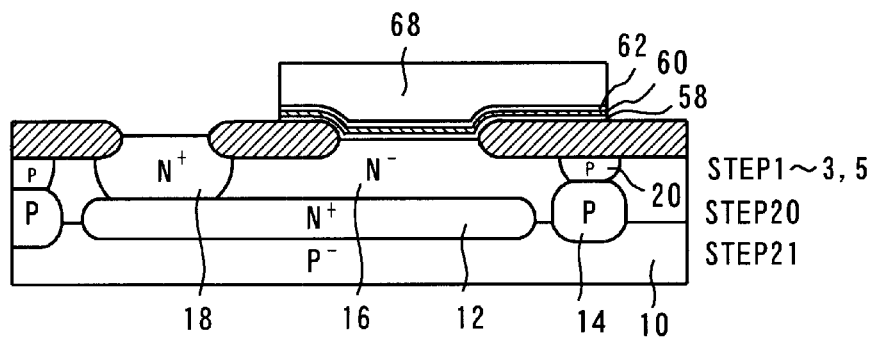
FIGS. 4A to 4D and FIGS. 5A and 5B are cross-sectional views for describing a method of manufacturing an HBT according to a second embodiment of the present invention.

As shown in FIG. 4A, in the HBT manufacturing procedure of the present embodiment, the diffusion layers 12, 14, 16, 18, and 20 are formed on the silicon substrate 10 in the same manner as in the first embodiment (steps 1 through 3).

Then, in the same manner as in the first embodiment, the silicon epitaxial layer 58, the SiGe epitaxial layer 60, and the silicon epitaxial layer 62 are formed over the entire surface of the wafer through the same steps as employed in the first embodiment (step 5).

The photoresist film 68 is formed on the silicon epitaxial layer 62 so as to assume the same shape as that of the base lead electrode 56 (step 20).

The three epitaxial layers 58, 60, and 62 are etched while the photoresist film 68 is used as a mask. Consequently, the epitaxial layers 58, 60, and 62 are patterned into the same shape as that of the base lead electrode 56 (step 21).

Figure 4B:
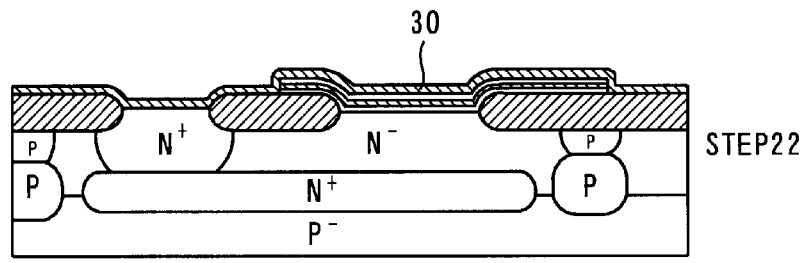

As shown in FIG. 4B, the oxide film 30 is deposited over the entire surface of the wafer (step 22).

Figure 4C:
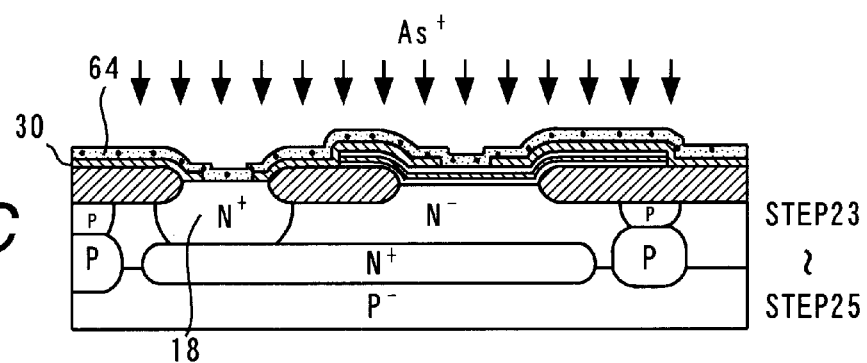

As shown in FIG. 4C, in the oxide film 30 there are formed an opening communicating with the area where the emitter electrode 28 is to be formed and an opening communicating with the n⁺-type collector lead layer 18 (step 23).

A polycrystalline silicon film 64 is deposited on the entire surface of the wafer (step 24).

N-type impurities, i.e., As (arsenic), are implanted into the polycrystalline silicon film 64 at a predetermined concentration (step 25).

Figure 4D:
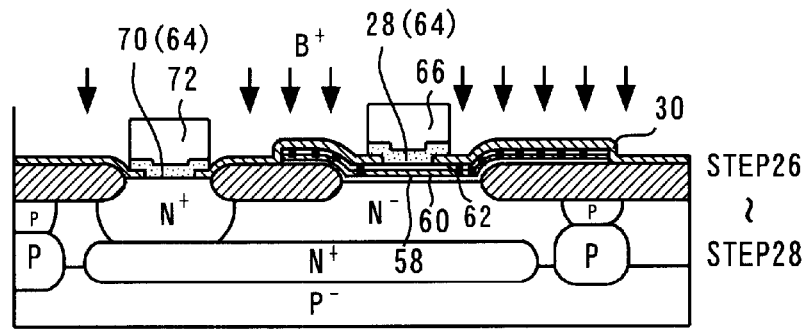

As shown in FIG. 4D, the photoresist film 66 for use in patterning the emitter electrode 28 and a photoresist film 72 for use in patterning the collector electrode 70 are formed on the polycrystalline silicon film 64 (step 26).

The polycrystalline silicon film 64 is etched while the photoresist films 66 and 72 are used as masks, to thereby form the emitter electrode 28 and the collector electrode 70 (step 27).

In order to implant impurities into the three epitaxial layers 58, 60, and 62, boron (B) is implanted through the oxide film 30 at a predetermined energy while the photoresist mask 66 is used as a mask (step 28).

Figure 5A:
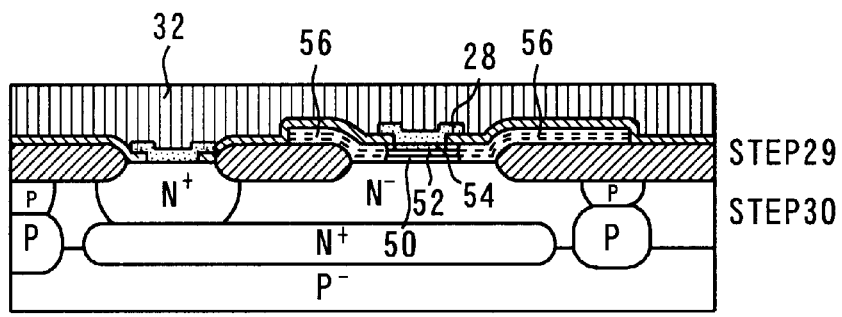
Figure 5B:
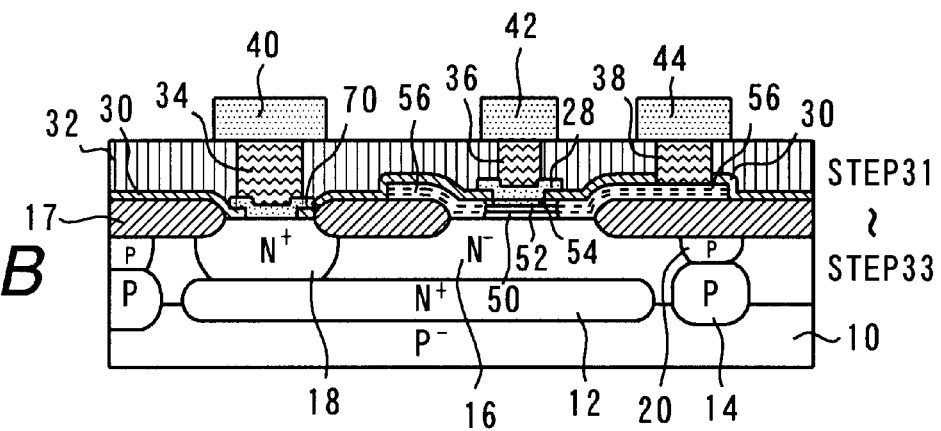

As shown in FIG. 5A, after removal of the photoresist films 66 and 72, the insulating film 32 is deposited over the entire surface of the wafer (step 29).

The entirety of the wafer is subjected to heat treatment at a predetermined temperature (step 30).

As in the case of the heat treatment (see step 16) performed in the first embodiment, there are formed the emitter layer 54 possessing the characteristic of an n-type semiconductor, and the base lead electrode 56 possessing the characteristic of a p-type semiconductor.

The thus-described round of processing operations is followed by formation of contact holes at appropriate positions in the insulating film 32 so as to uncover the collector electrode 70, the emitter electrode 28, and the base lead electrodes 56 (step 31).

Subsequently, the plugs 34, 36, and 38 are formed in the corresponding contact holes (step 32).

On the insulating film 32, the metal interconnection 40 is formed so as to communicate with the plug 34; the metal interconnection 42 is formed so as to communicate with the plug 36; and the metal interconnection 44 is formed so as to communicate with the plug 38, thereby embodying an HBT having the structure shown in FIG. 5B (step 33).

In the HBT according to the above-mentioned first embodiment, the contact hole accommodating the plug 34 is deeper than the other contact holes accommodating the plugs 36 and 38. Thus, in order to form the all the contact holes appropriately, the bottom portions of the contact holes accommodating the plugs 36 and 38, i.e., the emitter electrode 28 and the base lead electrode 56, must be overetched to a great extent. From the viewpoint of attainment of stable characteristics by protecting the emitter electrode 28 and the base lead electrode 56 from damage, a small amount of overetching is desirable.

In the HBT structure of the present embodiment, a collector electrode is formed on the $n^+$-type collector lead layer 18. The difference between the depth of the contact hole accommodating the plug 34 and the depths of the other contact holes 36 and 38 is made smaller than in the case of the first embodiment. Accordingly, as compared with the structure of the first embodiment, the HBT structure of the present embodiment makes the amount of overetching of the emitter electrode 28 and the base electrode 56 smaller and diminishes the amount of removal of the wafer.

Third Embodiment

Next will be described a method of manufacturing an HBT according to a third embodiment of the present invention, as well as the structure of the HBT. FIGS. 6A to 6D and FIG. 7 are cross-sectional views for describing a method of manufacturing the HBT of the present embodiment. Particularly, FIG. 7 shows the characteristic structure of the HBT of the present embodiment.

As shown in FIG. 7. in the HBT of the present embodiment, the oxide film 30 covering the base lead electrodes 56 still remains around the $n^+$-type collector lead layer 18. With the exception of this point, the HBT of the present embodiment is identical in structure with that employed in the first embodiment.

A method of manufacturing the HBT of the third embodiment will be described hereinbelow.

Figure 6A:
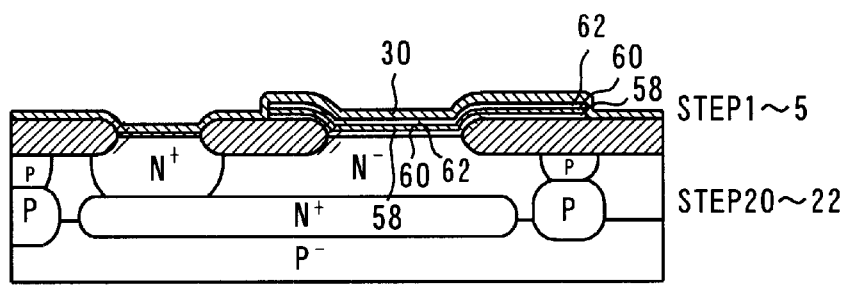
FIGS. 6A to 6D and FIG. 7 are cross-sectional views for describing a method of manufacturing an HBT according to a third embodiment of the present invention.
Figure 7:
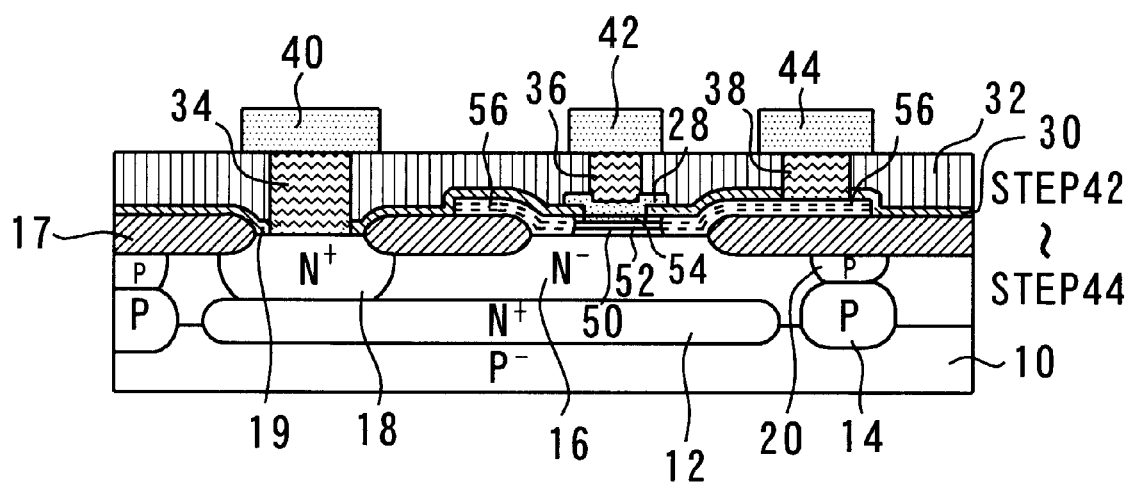

As shown in FIG. 6A, in the HBT manufacturing procedure of the present embodiment, the three epitaxial layers 58, 60, and 62 are formed on the entire surface of the wafer in the same manner as in the first embodiment (steps 1 through 5).

In the same manner as in the second embodiment, the epitaxial layers 58, 60, and 62 are patterned, to thereby form the oxide film 30 (steps 20 to 22).

Figure 6B:
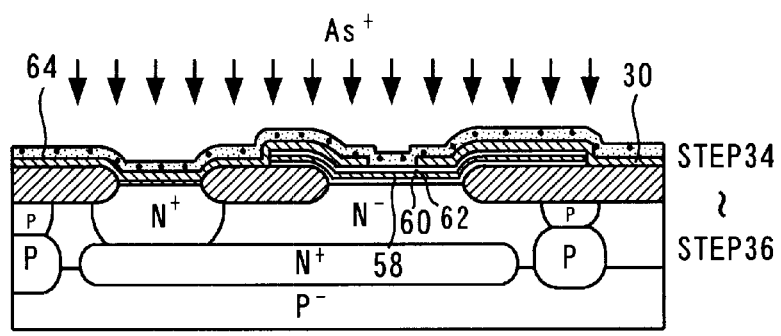

As shown in FIG. 6B, an opening is formed in the area of the oxide film 30 where the emitter electrode 28 is to be formed (step 34).

The polycrystalline silicon film 64 is deposited on the entire surface of the wafer (step 35).

N-type impurities, i.e., As (arsenic), are implanted into the polycrystalline silicon film 64 at a predetermined concentration (step 36).

Figure 6C:
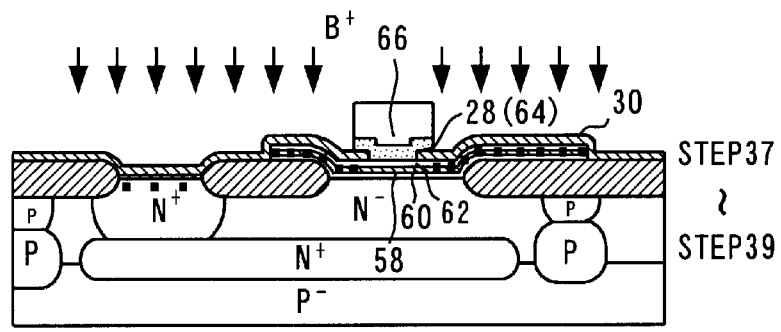

As shown in FIG. 6C, the photoresist film 66 is formed on the polycrystalline silicon film 64 for forming the emitter electrode 28 (step 37).

The polycrystalline film 64 is etched while the photoresist film 66 is used as a mask, thus forming the emitter electrode 28 (step 38).

In order to implant impurities into the three epitaxial layers 58, 60, and 62, boron (B) is implanted through the oxide film 30 at a predetermined energy while the photoresist film 66 is used as a mask (step 39).

Figure 6D:
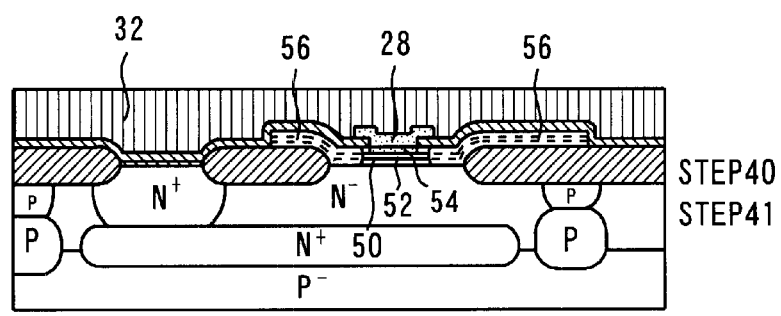

As shown in FIG. 6D, after removal of the photoresist film 66, the insulating film 32 is deposited over the entire surface of the wafer (step 40).

The entirety of the wafer is subjected to heat treatment at a predetermined temperature (step 41).

As in the case of the heat treatment (see step 16) performed in the first embodiment, there are formed the emitter layer 54 possessing the characteristic of an n-type semiconductor, and the base lead electrode 56 possessing the characteristic of a p-type semiconductor.

The thus-described round of processing operations is followed by formation of contact holes at appropriate positions in the insulating film 32 so as to uncover the $n^+$-type collector lead layer 18, the emitter electrode 28, and the base lead electrodes 56 (step 42).

Subsequently, the plugs 34, 36, and 38 are formed in the corresponding contact holes (step 43).

On the insulating film 32, the metal interconnection 40 is formed so as to communicate with the plug 34; the metal interconnection 42 is formed so as to communicate with the plug 36; and the metal interconnection 44 is formed so as to communicate with the plug 38, thereby embodying an HBT having the structure shown in FIG. 7 (step 44).

The HBT of the present embodiment can operate at the same speed as does the HBT of the first embodiment. Like the HBT of the first embodiment, the HBT of the third embodiment can also be manufactured through a simple process. Accordingly, the advantageous effect achieved by the HBT structure of the first embodiment can also be achieved by the HBT structure of the present embodiment.

Fourth Embodiment

Next will be described a method of manufacturing an HBT according to a fourth embodiment of the present invention, as well as the structure of the HBT. FIGS. 8A to 8D and FIGS. 9A to 9D are cross-sectional views for describing a method of manufacturing the HBT of the present embodiment. Particularly, FIG. 9D shows the characteristic structure of the HBT of the present embodiment.

As shown in FIG. 9D, the HBT of the present embodiment comprises a silicide film 74 covering the surface of the emitter electrode 28, a silicide film 76 covering the surface of the base lead electrode 56, and a silicide film 78 covering the surface of the $n^+$-type collector lead layer 18. A sidewall 80 is formed from an oxide film on the side surface of the emitter electrode 28 in order to prevent occurrence of a short circuit between the emitter electrode 28 and the base lead electrodes 56. A sidewall 82 is formed from an oxide film on the side surface of each of the base lead electrodes 56 so as to become continuous with the field oxide film 17. With the exception of this point, the HBT of the present embodiment is identical in structure with the HBT of the first embodiment.

Figure 8A:
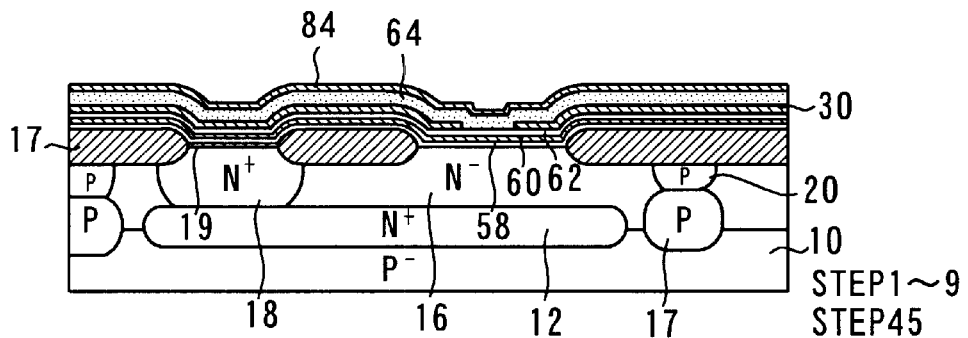
FIGS. 8A to 8D and FIGS. 9A to 9D are cross-sectional views for describing a method of manufacturing an HBT according to a fourth embodiment of the present invention.

As shown in FIG. 8A, in the HBT manufacturing process of the present embodiment, the polycrystalline silicon film 64 is formed on the silicon substrate 10 in the same manner as in the case of the first embodiment, and n-type impurities; that is, As, are implanted into the polycrystalline film 64 at a predetermined concentration (steps 1 through 9).

A second oxide film 84 is formed on the polycrystalline silicon film 64 for the purpose of diminishing the amount of overetching to be performed later (step 45).

Figure 8B:
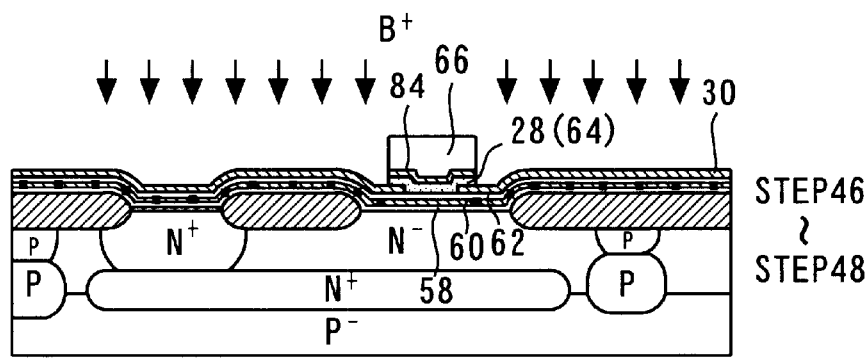

As shown in FIG. 8B, the photoresist film 66 for use in patterning the emitter electrode 28 is formed on the second oxide film 84 (step 46).

The second oxide film 84 and the polycrystalline silicon film 64 are etched while the photoresist film 66 is used as a mask, thereby forming the emitter electrode 28 coated with the second oxide film 84 (step 47).

In order to implant impurities into the three epitaxial layers 58, 60, and 62, boron (B) is implanted through the oxide film 30 at a predetermined energy while the photoresist mask 66 is used as a mask (step 48).

Figure 8C:
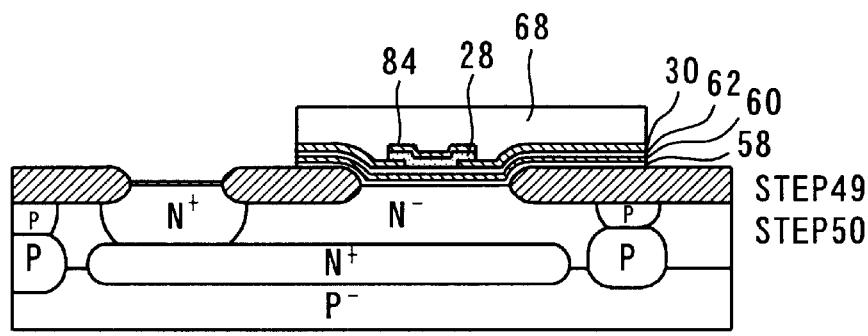

As shown in FIG. 8C, the photoresist film 68 is formed on the oxide film 30 so as to assume the same shape as that of the base lead electrodes 56 (step 49).

The three epitaxial layers 58, 60, and 62 are etched while the photoresist mask 68 is used as a mask. Consequently, the epitaxial layers 58, 60, and 62 are patterned into the same shape as that of the base lead electrodes 56 (step 50).

Figure 8D:
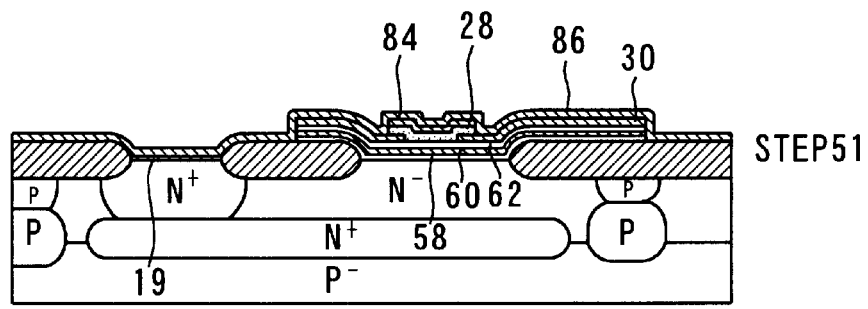

As shown in FIG. 8D, after removal of the photoresist film 66, a third oxide film 86 is formed over the entire surface of the wafer. The side surface of the emitter electrode 28 and the side surfaces of the epitaxial layers 58, 60, and 62 are coated with the thus-formed third oxide film 86 (step 51).

On the epitaxial layer 62 is formed the oxide film 30 beforehand. Further, on the $n^+$-type collector lead layer 18 is formed the oxide film 19 beforehand, and on the emitter electrode 28 is formed the second oxide film 84 beforehand. Therefore, at a point in time when the third oxide film 86 has been formed, there exist multi-layered oxide films each having a substantially uniform thickness over the epitaxial layer 62, the $n^+$-type collector lead layer 18, and the emitter electrode 28, respectively.

Figure 9A:
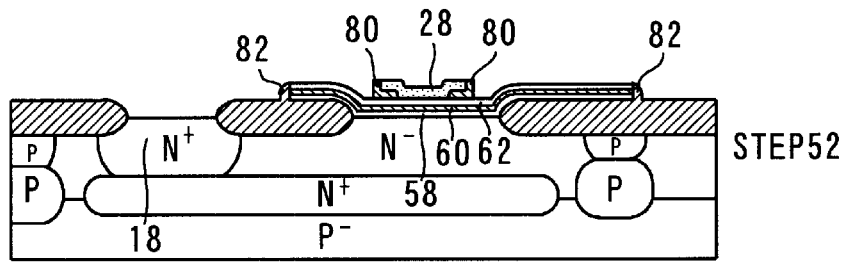

As shown in FIG. 9A, the oxide films are anisotropically etched until the epitaxial layer 62, the $n^+$-type collector lead layer 18, and the emitter electrode 28 become exposed (step 52).

As mentioned above, there exist the oxide films each having a substantially uniform thickness over the three layers; that is, the epitaxial layer 62, the $n^+$-type collector lead layer 18, and the emitter electrode 28. Therefore, these three layers can be made exposed without involving any excessive overetching. In the present embodiment, the epitaxial layer 62, the $n^+$-type collector lead layer 18, and the emitter electrode 28 can be made appropriately exposed without damage being inflicted on any one of these layers. Through the foregoing processing operation, the sidewall 80 is formed on the side surface of the emitter electrode 28, and the sidewall 82 is formed on the side surfaces of the epitaxial layers 58, 60, and 62.

Figure 9B:
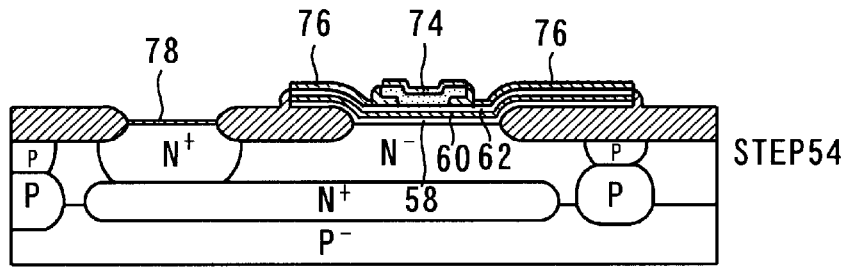

As shown in FIG. 9B, the silicide layer 74 is formed on the exposed surface of the emitter electrode 28; the silicide layer 76 is formed on the exposed surface of the epitaxial layer 62; and the silicide layer 78 is formed on the exposed surface of the $n^+$-type collector lead layer 18 (step 54).

The silicide layers 74, 76, and 78 can be formed by depositing high-melting-point metal prone to react with silicon, such as Co, over the entire surface of the wafer, and by subjecting the wafer to heat treatment at a predetermined temperature. The portion of the high-melting-point metal that has been deposited on the field oxide film 17 and has not reacted with silicon is removed after the heat treatment.

Figure 9C:
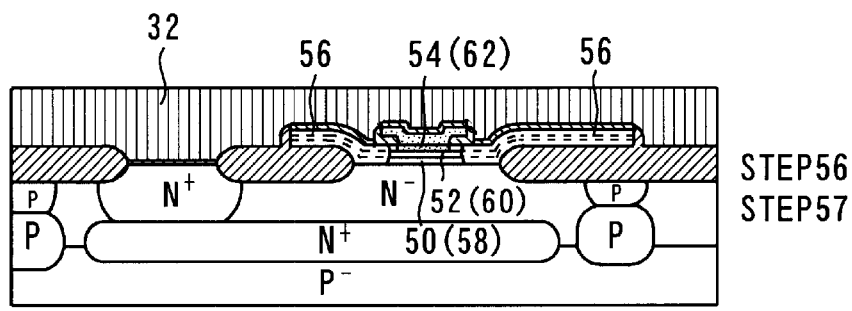
Figure 9D:
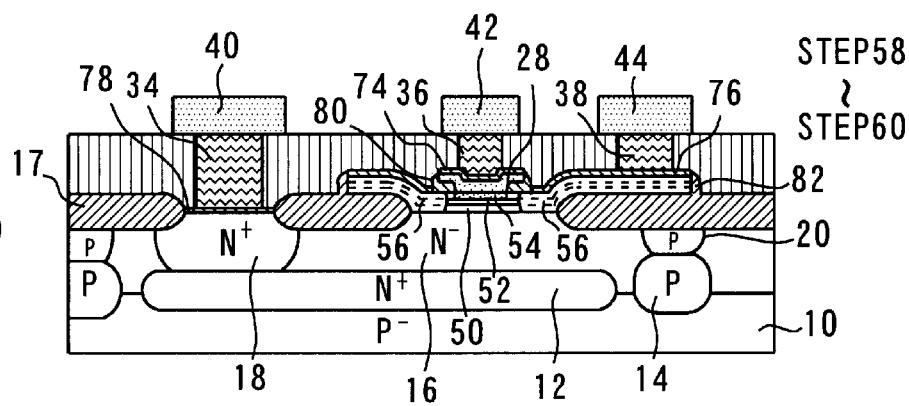

As shown in FIG. 9C, the insulating film 32 is deposited over the entire surface of the wafer (step 56).

The entirety of the wafer is subjected to heat treatment at a predetermined temperature (step 57).

As in the case of the heat treatment performed in the first embodiment (see step 16), there are formed the emitter layer 54 possessing the characteristic of an n-type semiconductor, and the base lead electrode 56 possessing the characteristic of a p-type semiconductor.

The thus-described round of processing operations is followed by formation of contact holes at appropriate positions in the insulating film 32 so as to uncover the silicide layers 74, 76, and 78 (step 58).

Subsequently, the plugs 34, 36, and 38 are formed in the corresponding contact holes (step 59).

On the insulating film 32, the metal interconnection 40 is formed so as to communicate with the plug 34; the metal interconnection 42 is formed so as to communicate with the plug 36; and the metal interconnection 44 is formed so as to communicate with the plug 38, thereby embodying an HBT having the structure shown in FIG. 9D (step 60).

In the HBT structure of the present embodiment, the surface of the base lead electrodes 56 is covered with the silicide layer 76, thereby rendering the resistance of the base region of the HBT sufficiently low. The exposed surface of the emitter electrode 28 is coated with the silicide layer 74, and the exposed surface of the $n^+$-type collector lead layer 18 is coated with the silicide layer 78. The silicide layer 74 can sufficiently diminish contact resistance arising between the plug 36 and the emitter electrode 28, and the silicide layer 76 can sufficiently diminish contact resistance arising between the plug 34 and the $n^+$-type collector lead layer 18. The HBT of the present embodiment can achieve a high-frequency characteristic and a noise reduction effect better than those achieved by the HBT of the first embodiment.

The HBT of the fourth embodiment corresponds to the HBT of the first embodiment that is additionally provided with the silicide layers 74, 76, and 78. The present invention is not limited to such an embodiment; the present invention may also be embodied by addition of the silicide layers 74, 76, and 78 to the HBT according to either the second or third embodiment.

Fifth Embodiment

Figure 10A:
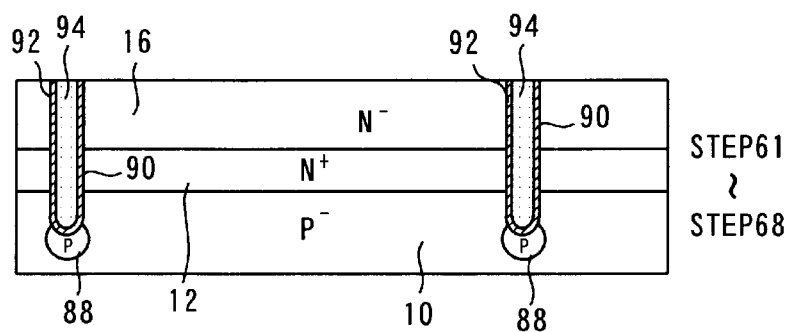
FIGS. 10A to 10C are cross-sectional views for describing a method of manufacturing an HBT according to a fifth embodiment of the present invention.
Figure 10B:
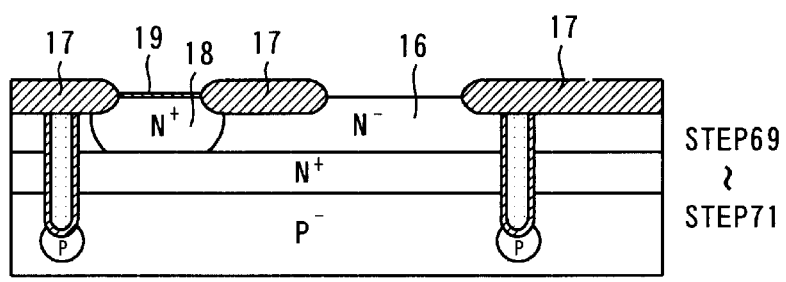
Figure 10C:
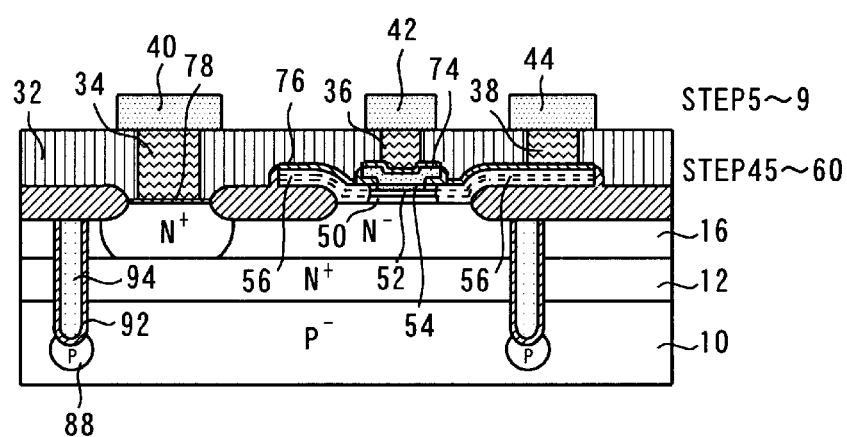

Next will be described a method of manufacturing an HBT according to a fifth embodiment of the present invention, as well as the structure of the HBT. FIGS. 10A to 10C are cross-sectional views for describing a method of manufacturing the HBT of the present embodiment. The HBT of the present embodiment is characterized in that an element isolation p-type diffusion layer 88 is provided in lieu of the p-type diffusion layer 14 and the element isolation p-type diffusion layer 20 that are employed in the first through fourth embodiments. With the exception of this point, the HBT of the present embodiment is identical in structure with that of the fourth embodiment. The HBT structure forming the basis of the present invention is not limited to that of the fourth embodiment; the HBT structure of any of the first through third embodiments may also be employed.

A method of manufacturing the HBT of the fifth embodiment will now be described.

As shown in FIG. 10A, in the HBT manufacturing procedure of the present embodiment, the $n^+$-type diffusion layer 12 is first formed on the silicon substrate 10 that accords with a p-type semiconductor (step 61).

The n type silicon layer 16 is formed on the $n^+$-type diffusion layer 12 (step 62).

Trenches 90 for separating the wafer into a desired geometry are formed in the $n^+$-type diffusion layer 12 and the n type silicon layer 16 (step 64).

The element-isolation p-type diffusion layer 88 is formed at the bottom of each of the trenches 90 (step 65).

The wafer is subjected to oxidization treatment in order to form an oxide film 92 on the side surface of the trench 90 (step 66).

After completion of the oxidation treatment, an insulating substance 94, such as polycrystalline silicon, is deposited, to thereby fill the trenches 90 (step 67).

The oxide film 92 or the insulating substance 94, which has been deposited until it extends over the surface of the wafer (i.e., the surface of the n-type silicon layer 16), is etched away, whereby the wafer has reached the state shown in FIG. 10A (step 68).

As shown in FIG. 10B, the field oxide film 17 is formed on the surface of the n-type silicon layer 16 (step 69).

Next, the $n^+$-type collector lead layer 18 is formed in a portion of the $n^-$-type silicon layer 16 (step 70).

After the oxide film 19 has been formed on the exposed surface of the $n^-$-type silicon layer 16 and the exposed surface of the $n^+$-type collector layer 18, the oxide film 19 is removed from the surface of the wafer except in the position located above the $n^+$-type collector lead layer 18. Consequently, the oxide film 19 is formed at only the position located above the $n^+$-type collector layer 18 (step 71).

The wafer is subjected to processing in the same manufacturing steps as those employed in the fourth embodiment; i.e., above-described steps 5 through 9 and steps 45 through 60, hereby realizing the HBT structure shown in FIG. 10C.

In the HBT according to any of the first through fifth embodiments, collector-substrate parasitic capacitance is greatly affected by the width of a depletion layer developing between the $n^+$-type diffusion layer 12 and the adjacent p-type diffusion layer (14 or 88). In the HBT structure according to the first through third embodiments, a short distance separates the n+-type diffusion layer 12 and the p-type diffusion layer 14, and the width of a depletion layer developing between them is narrow. Hence, high collector-substrate parasitic capacitance is likely to arise. In contrast, in the HBT structure of the present embodiment, the $n^+$-type diffusion layer 12 and the p-type diffusion layer 88 are separated by a long distance, and a depletion layer of large extension can been ensured. Therefore, the collector-substrate parasitic capacitance can be readily made low.

As the collector-substrate parasitic capacitance becomes lower, the HBT exhibits a better high-frequency characteristic. Hence, the HBT of the present embodiment can achieve a high-frequency characteristic far better than that achieved by the HBTs according to the first through fourth embodiments.

Sixth Embodiment

Next will be described an HBT according to a sixth embodiment of the present invention, with reference to FIGS. 11A and 11B. The HBT of the present embodiment can be embodied on the basis of any one of the HBTs according to the first through fifth embodiments, by changing the impurity content (i.e., P content) profile of the epitaxial layer 58 from that shown in FIG. 3 to that shown in FIG. 11A.

Figure 11A:
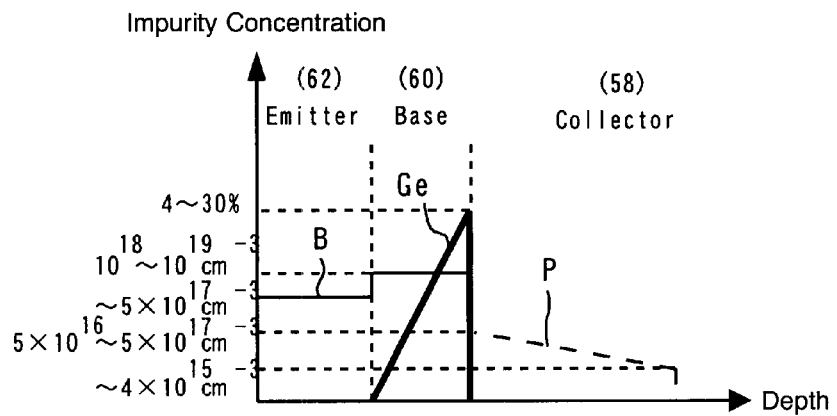
FIGS. 11A and 11B show profiles about the concentration of impurities and Ge incorporated to the three epitaxial layers included in the HBT according to a sixth embodiment of the present invention.

FIG. 11A shows a profile about the concentration of impurities and Ge incorporated to the three epitaxial layers 58, 60, and 62. In the present embodiment, the B content of the silicon epitaxial layer 62 that is to become an emitter region of the HBT and the B content and Ge content of the epitaxial layer 60 that is to become a base region of the HBT assume the same profiles as those obtained in the first through fifth embodiments (see FIG. 3). Further, the P content of the epitaxial layer 58 that is to become a collector region of the HBT assumes a profile differing from that obtained in the first through fifth embodiments. According to the profile, the P content, gradually decreases from the boundary area between the collector region and the base region toward the bottom of the epitaxial layer 58.

When the HBT operates at high frequency, there may arise a phenomenon in which an effective base region spreads up to a collector region in association with implantation of a large amount of carriers: i.e., a base spreading effect. In the event of occurrence of a base spreading effect, the time required for carriers to run through a base region becomes longer, thereby impairing the high-frequency characteristic of the HBT. Thus, prevention of the base spreading effect is effective for improving the high-frequency characteristic of the HBT. The base spreading effect of the HBT can be diminished by means of increasing the impurity content of the collector region so as to prevent spread of an effective base region. However, if the impurity content of the entire collector region is increased, the withstand voltage of the HBT is disadvantageously deteriorated.

As mentioned above, in the present embodiment, the epitaxial layer 58 which is to become a collector region is doped with P at a concentration profile such that concentration becomes high at a boundary region between the collector region and the base region and becomes low at a boundary region between the collector region and the substrate 10. Such a concentration profile of P ensures the withstand voltage of the HBT and effectively prevents a base spreading effect, which would otherwise be caused when the HBT operates at high frequency. Accordingly, the HBT of the present embodiment can achieve a high frequency characteristic much better than that achieved by the HBTs of the first through fifth embodiments.

Figure 11B:
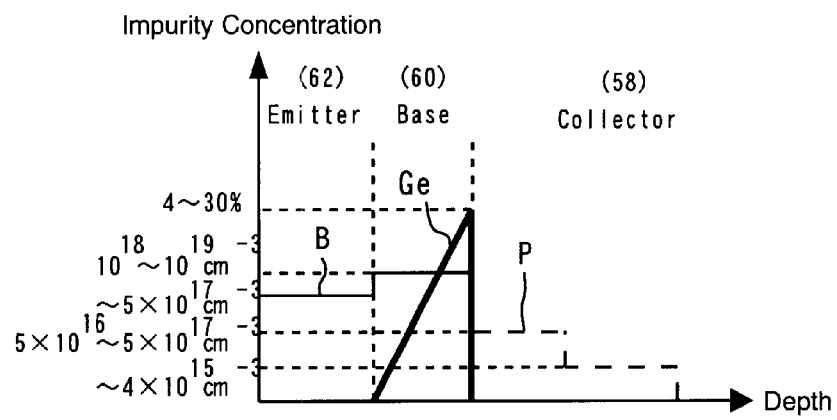

FIG. 11B shows another example profile of the concentration of impurities and Ge incorporated into the epitaxial layers 58, 60, and 62. The profile of impurities and Ge implanted to the epitaxial layer 58 that is to become a collector region may assume a step-wise change. Even in a case where such a profile is employed by the HBT, there is yielded the same advantageous effect as that yielded in the case where the profile shown in FIG. 11A is employed by the HBT.

Seventh Embodiment

Next, an HBT according to a seventh embodiment of the present invention will be described with reference to FIGS. 12A to 12C.

Figure 12A:
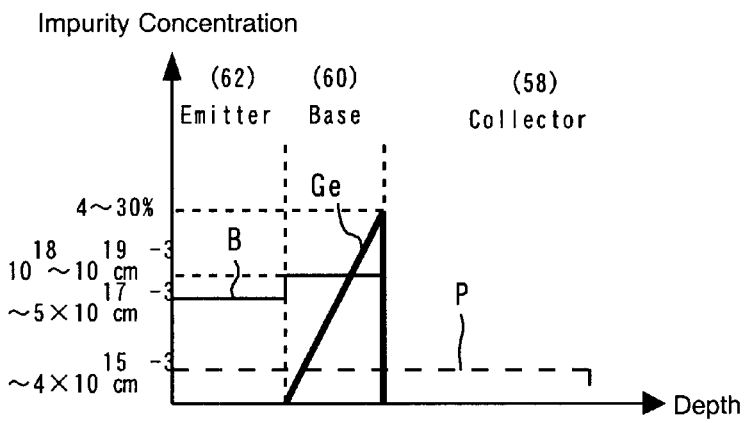
FIGS. 12A to 12C show profiles about the concentration of impurities and Ge incorporated to the three epitaxial layers included in the HBT according to a seventh embodiment of the present invention.
Figure 12B:
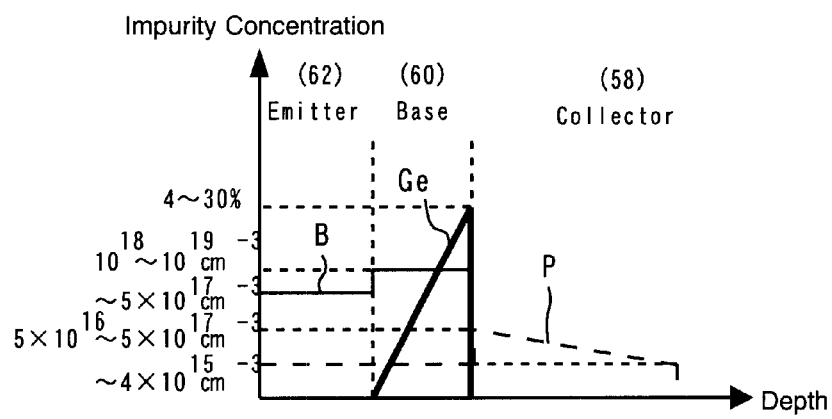
Figure 12C:
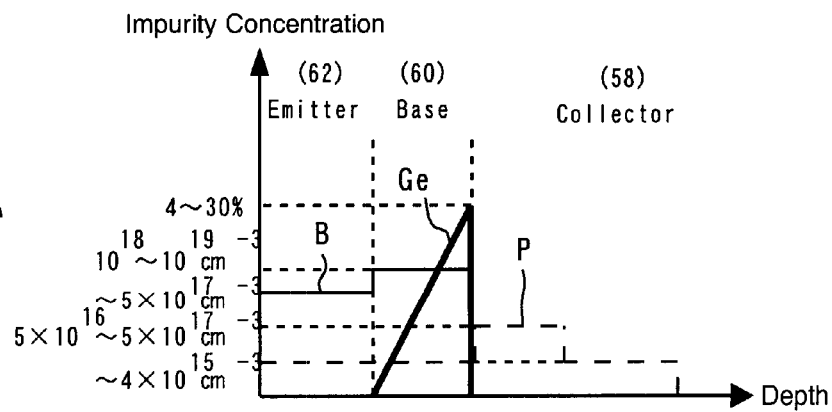

FIGS. 12A to 12C show example profiles of the concentration of impurities and Ge incorporated into the epitaxial layers 58, 60, and 62 in the present embodiment.

In the first through sixth embodiments, P is incorporated into neither the epitaxial layer 60 that is to become a base region nor the epitaxial layer 62 that is to become an emitter region. In the present embodiment, incorporating P to the epitaxial layers 60 and 62 at a concentration of $4 \times 10^{15}$ cm$^{-3}$ or thereabouts is allowed. The P content ($4 \times 10^{15}$ cm$^{-3}$) is sufficiently lower than the B content ($5 \times 10^{17}$ cm$^{-3}$ to $5 \times 10^{15}$ cm$^{-3}$) of the epitaxial layers 60 and 62. Accordingly, the HBT of the present embodiment can achieve an appropriate transistor characteristic even when the epitaxial layers 60 and 62 contain P at such a concentration.

The epitaxial layers 60 and 62 should be formed successively through an identical step in which the epitaxial layer 58 to be doped with P is formed. For this reason, complete elimination of P from these layers is not necessarily easy. In the present embodiment, contamination of the epitaxial layers 60 and 62 with P is allowed, and hence the three epitaxial layers 58, 60, and 62 can be readily formed successively. The HBT of the present embodiment can achieve productivity better than that achieved by the HBTs of the first through sixth embodiments.

COMPARATIVE EXAMPLE 1

Figure 14A:
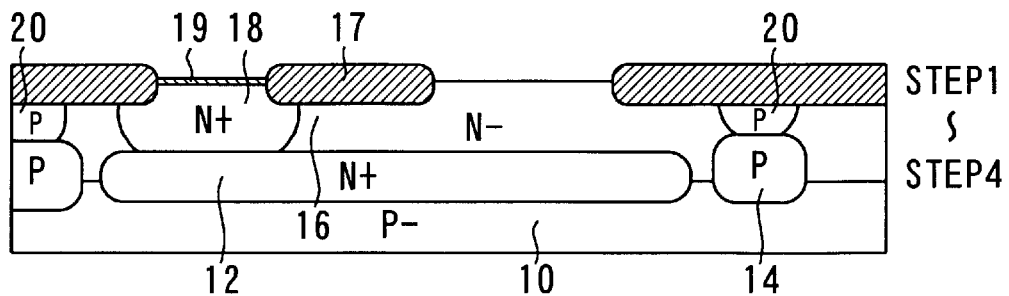
FIGS. 14A to 15 are cross-sectional views for describing a method of manufacturing a bipolar transistor according to a comparative example.
Figure 14B:
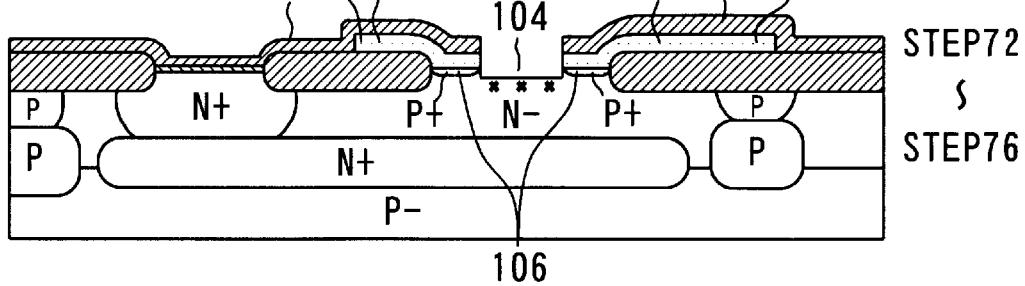
Figure 14C:
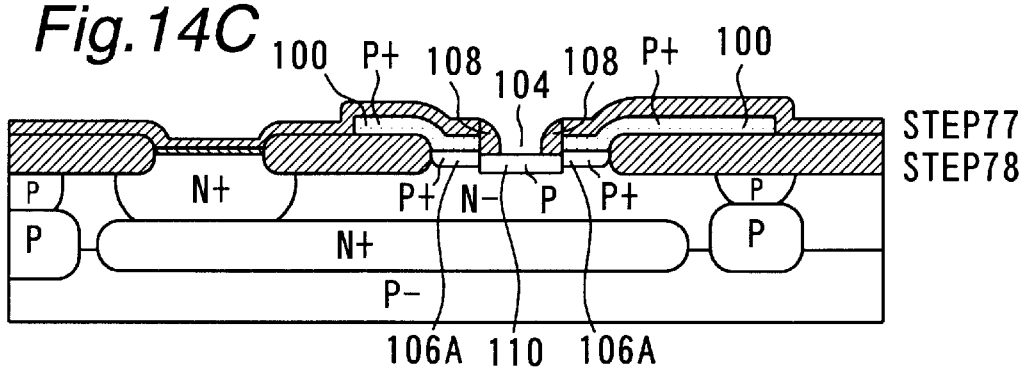
Figure 14D:
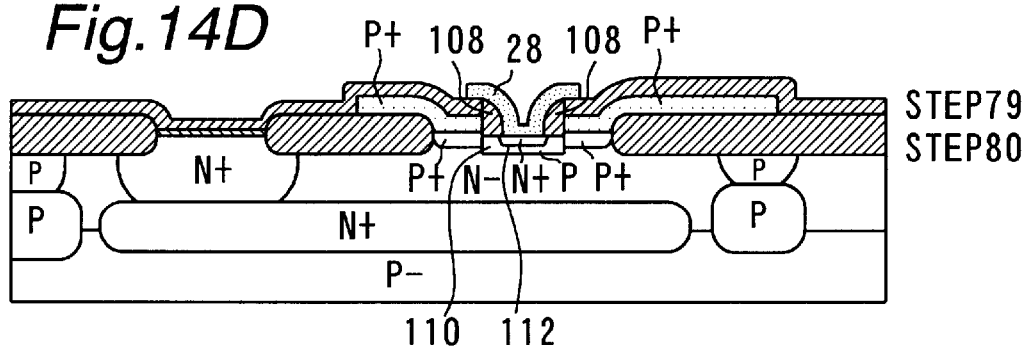
Figure 15:
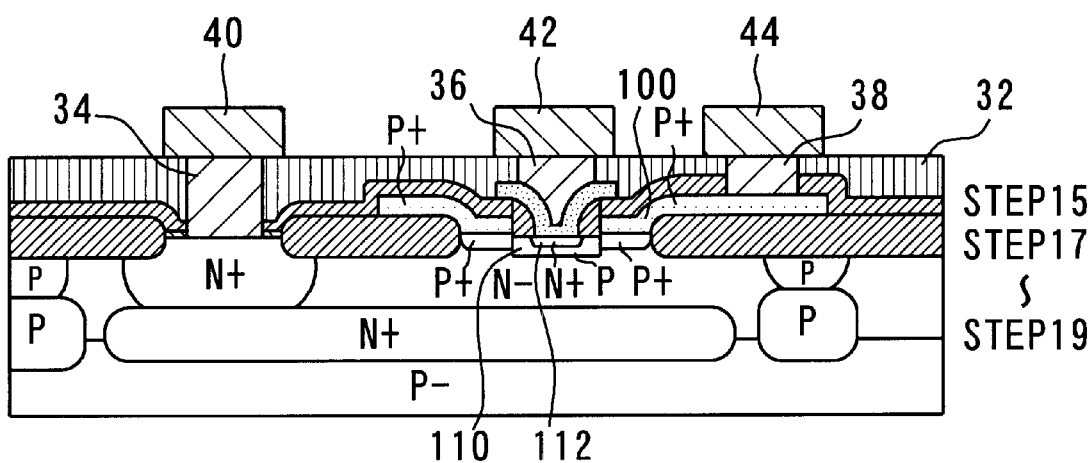

Referring to FIGS. 14A through 15, there will now be described a manufacturing method according to Comparative Example 1 for comparison with the manufacturing method according to the present invention. Comparative Example 1 is directed to a method of fabricating a bipolar transistor having a homo-junction. As will be described later, according to the manufacturing method according to Comparative Example 1, an emitter electrode can be formed between two base lead electrodes by means of a self-alignment technique.

FIGS. 14A through 14D and FIG. 15 are cross-sectional views for describing the manufacturing method according to Comparative Example 1. In Comparative Example 1, a transistor shown in FIG. 14A is formed by means of the same technique as that employed in the first embodiment.

Specifically, in Comparative Example 1, an n$^+$-type diffusion layer 12 and a p-type diffusion layer 14 are formed on the silicon substrate 10 (p$^-$-type semiconductor) (step 1).

An n$^-$-type silicon layer 16 is formed over the n$^+$-type diffusion layer 12 and the p-type diffusion layer 14 through epitaxial growth (step 2).

After formation of a field oxide film 17, an n$^+$-type collector lead layer 18 and an element isolation p-type diffusion layer 20 are formed (step 3).

An oxide film 19 is formed on exposed areas of silicon to a predetermined thickness. The oxide film 19 is removed with the exception of the area located directly above the n$^+$-type collector lead layer 18 (step 4).

As shown in FIG. 14B, a polycrystalline silicon film 100 doped with p-type impurities is deposited on the n$^-$-type silicon layer 16. The polycrystalline silicon film 100 is patterned in the shape of a base lead electrode (step 72).

An oxide film 102 is formed over the entire surface of the semiconductor wafer so as to cover the polycrystalline silicon film 100 (step 73).

An opening 104 is formed in the area where an intrinsic base layer is to be formed, by means of etching the polycrystalline silicon film 100 and the oxide film 102 (step 74).

As a result of the semiconductor wafer being subjected to predetermined heat treatment, the p-type impurities contained in the polycrystalline silicon film 100 are diffused into the n$^-$-type silicon layer 16, to thereby form a p$^+$-type diffusion layer 106 (step 75).

P-type impurities, such as boron (B), are implanted into the semiconductor wafer from above the opening 104. As a result, p-type impurities are implanted into an exposed area of the n$^-$-type silicon layer 16 located within the opening 104; that is, an area where an intrinsic base layer is to be formed (step 76).

As shown in FIG. 14C, a side wall 108 is formed along the interior of the opening 104, by means of deposition of a oxide film and anisotropic etching (step 77).

As a result of the semiconductor wafer being subjected to predetermined heat treatment at the time of formation of the side wall 108, activation of the p-type impurities implanted into the n$^-$-type silicon layer 16 and diffusion of p$^+$-type diffusion layer 106 proceed. As a result, an intrinsic base layer 110 and a p$^+$-type diffusion layer 106A are formed on the n$^-$-type silicon layer 16 (step 78).

As shown in FIG. 14D, an emitter electrode 28 is formed from polycrystalline silicon doped with n-type impurities, within the area enclosed by the side wall 108 (step 79).

The semiconductor substrate is then subjected to predetermined heat treatment, to thereby diffuse the n-type impurities contained in the emitter electrode 28. An emitter layer 112 is thus formed in the vicinity of the surface of the intrinsic base layer 110 (step 80).

Finally, as shown in FIG. 15, the dielectric film 32 is deposited over the entire surface of the semiconductor wafer (step 15). Contact holes are formed at suitable positions (step 17). Then, the plugs 34, 36, 38 and the metal interconnections 40, 42, and 44 are formed (steps 18 and 19).

As mentioned above, according to Comparative Example 1, the emitter layer 112 can be formed in the center of the intrinsic base layer 110 by means of the self-alignment technique. Thus, according to Comparative Example 1, the intrinsic base layer 110 can be sufficiently reduced in size without inducing a short circuit between the emitter layer 112 and the base lead electrode (polycrystalline silicon film 100).

As mentioned above, a reduction in base-to-collector capacitance is effective for increasing the operating speed of the bipolar transistor. In this respect, as mentioned previously, Comparative Example 1—which enables a reduction in base-to-collector capacitance by means of making the intrinsic base layer 110 small—is suitable for increasing the operating speed of the bipolar transistor.

In addition to a reduction in base-to-collector capacitance, a reduction in the width of a base electrode is also important for increasing the operating speed of the bipolar transistor. More specifically, in the case of Comparative Example 1, a reduction in the thickness of the intrinsic base layer 110 is also important. However, in Comparative Example 1, the intrinsic base layer 110 is formed by means of implantation of impurities. In such a case, a channeling phenomenon or variations in the depth of implantation renders difficult controlling the thickness of the intrinsic base layer 110 to a value of 100 nm or less. In this respect, Comparative Example 1 shows a limitation on an increase in the operating speed of a bipolar transistor.

In contrast, in the previously-described first through seventh embodiments, the thickness of the base layer 52 can be determined by the thickness of the Si epitaxial layer 58. Accordingly, the manufacturing methods according to these embodiments are superior to the method of Comparative Example 1 in terms of the operating speed of a bipolar transistor being increased by means of rendering the base layer 52 thin.

According to the manufacturing methods described in connection with the first through seventh embodiments, the position of the oxide film 30 is determined by means of, for example, photolithography, as shown in FIG. 2A. According to the manufacturing methods described in connection with the first through seventh embodiments, misregistration may arise in the position of the opening of the oxide film 30; that is, a location between the position of the emitter layer 54 and the position of the emitter electrode 28, within an overlay accuracy of photolithography.

In the first through seventh embodiments, the position of the base layer 52 and the position of the base lead electrode 56 are determined by the position of the emitter electrode 28. Accordingly, in these embodiments, there may be a case where the position of the base layer 52 and the position of the base lead electrode 56 vary relative to the position of the emitter layer 54 within an overlay accuracy of photolithography. More specifically, according to the manufacturing methods described in the first through seventh embodiments, the position of the emitter layer 54 relative to the center of the base layer 52 is not determined in a self-aligned manner, and the emitter layer 54 may be formed in a position close to one direction inside the base lead electrode 56. For this reason, in the first through seventh embodiment, a margin which takes into consideration such an offset must be imparted to the dimension of the emitter electrode 28 and that of the base layer 52.

As mentioned above, the manufacturing method according to Comparative Example 1 which embodies the intrinsic base layer 110 by means of implanting impurities into the opening 104 has a merit and a disadvantage. Similarly, the manufacturing methods described in connection with the first through seventh embodiments which determines the thickness of the base layer 52 is determined by the thickness of the Si epitaxial layer 58 has a merit and a disadvantage. The merits obtained by these manufacturing methods can be simultaneously ensured by means of selectively forming a base layer in only the opening 104 (see FIG. 14B) which has been formed according to the method described in Comparative Example 1 by means of epitaxial growth.

However, selective growth of a base layer is difficult in practice. Moreover, a base layer would be formed on the n⁻-type silicon layer 16 which has been damaged by etching in such a case, whereby resulting in a problem in terms of film quality. Accordingly, mere combination of the manufacturing method according to Comparative Example 1 and the manufacturing methods according to the first through seventh embodiments does not enable self-aligned determination of position of the emitter electrode 28 or formation of the base layer 52 through use of an epitaxially-grown film.

Eighth through eleventh embodiments, which will be described below, relate to a manufacturing method for solving the above-described drawback; more specifically, a manufacturing method of forming the emitter layer 54 in a self-aligned manner in the vicinity of the center of the base layer 52; that is, the center of the base lead 56, and forming the base layer 52 through use of an epitaxially-grown film. Each of the eighth through eleventh embodiments will be sequentially described by reference to FIGS. 16 through 22.

Eighth Embodiment

Figure 16A:
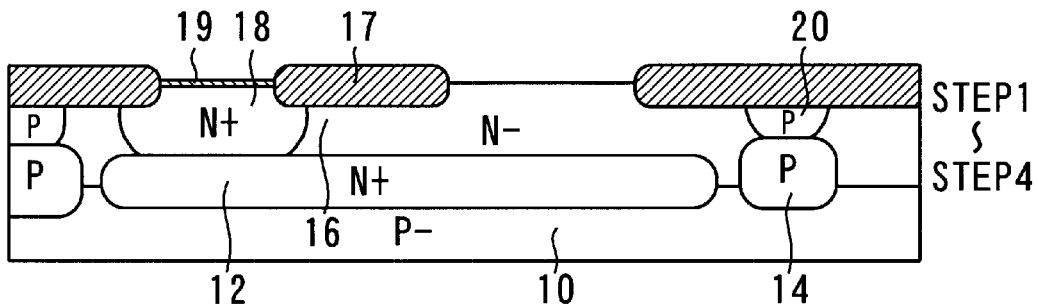
FIGS. 16A to 18D are cross-sectional views for describing a method of manufacturing a bipolar transistor according to a eighth embodiment of the present invention.
Figure 16B:
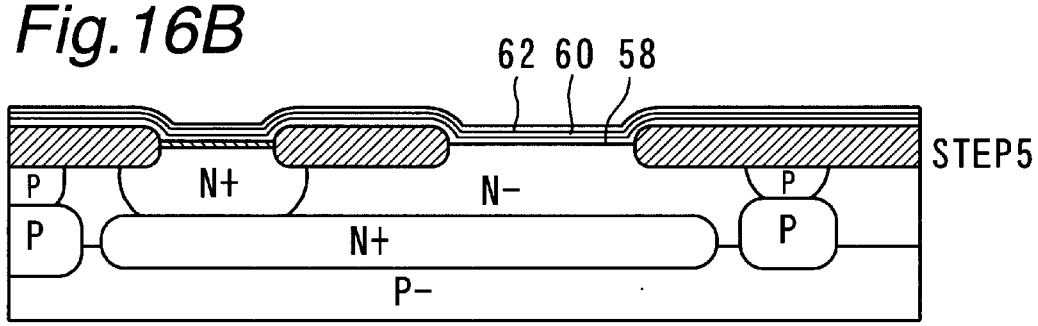

FIGS. 16A through 18D are cross-sectional views for describing a method of fabricating a bipolar transistor according to an eighth embodiment of the present invention. As shown in FIGS. 16A and 16B, the Si epitaxial layer 58 (of n-type), an SiGe epitaxial layer 60 (of p-type), and an Si epitaxial layer 62 (of p-type) are formed over the entire surface of the semiconductor wafer, in the sequence given (steps 1 through 5).

Figure 16C:
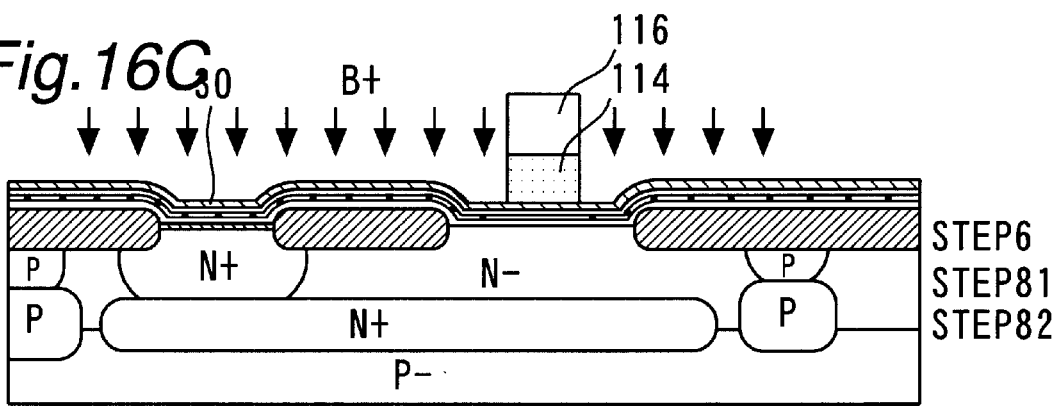

As shown in FIG. 16C, the oxide film 30 is deposited on the Si epitaxial layer 62 (step 6).

Next, a polycrystalline silicon film 114 and a photoresist film 116 are deposited on the oxide film 30. The photoresist film 116 is patterned so as to cover only the area where an intrinsic base layer is to be formed. As a result of the semiconductor substrate being etched while the thus-patterned photoresist film 116 is used as a mask, the polycrystalline silicon film 114 is patterned in the shape of an intrinsic base layer (step 81).

P-type impurities, such as boron (B), are implanted into the thus-patterned polycrystalline silicon film 114 from above. As a result, the three epitaxial layers 58, 60, and 62 are doped with p-type impurities, with the exception of an area where an intrinsic base layer is to be formed (step 82).

Figure 16D:
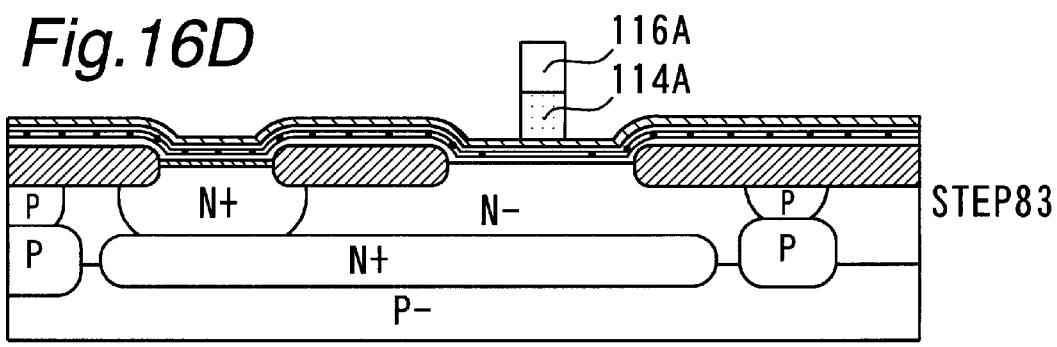

The photoresist film 116 is reduced in size to a specific size by means of isotropic etching; that is, the dimension of an emitter layer which is to be formed on the surface of an intrinsic base layer. The polycrystalline silicon film 114 is reduced in size to a specific size by means of anisotropic etching; that is, the dimension of an emitter layer which is to be formed on the surface of an intrinsic base layer (step 83). As shown in FIG. 16D, the polycrystalline silicon film 114 that has been reduced in size is designated by 114A, and the photoresist film 116 that has been reduced in size is designated by 116A.

Figure 17A:
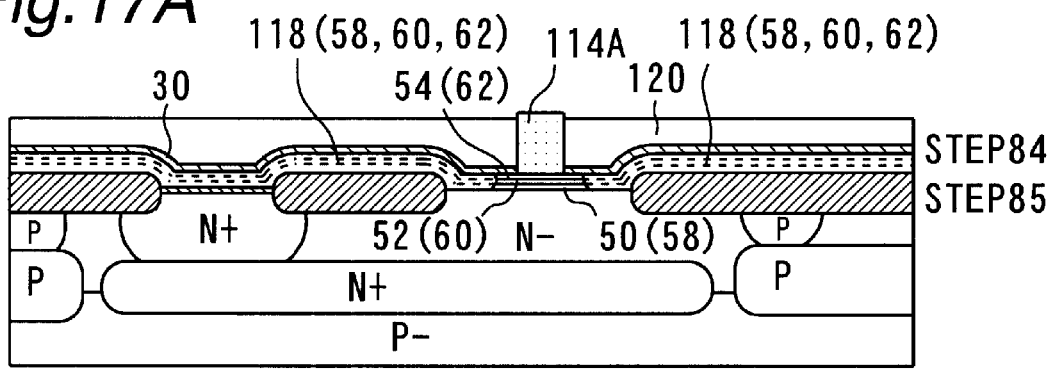

After removal of the photoresist film 116A, the semiconductor wafer is subjected to predetermined heat treatment, wherewith the impurities (B) implanted in the three epitaxial layers 58, 60, and 62 diffuse, thus forming the p-type diffusion layer 118, as shown in FIG. 17A (step 84).

Photoresist 120 is applied to the entire surface of the semiconductor wafer. The photoresist 120 is etched back until the upper end of the polycrystalline silicon film 114A is exposed (step 85).

Figure 17B:
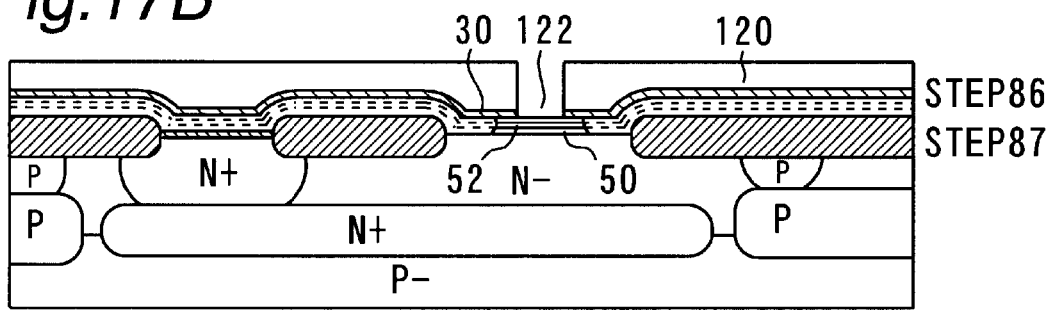

As shown in FIG. 17B, the polycrystalline film 114A that is exposed on the surface of the photoresist 120 is etched away (step 86).

Further, the oxide film 30 is etched while the photoresist 120 is used as a mask, as a result of which an opening 122 is formed in a location where an emitter layer is to be formed (step 87).

Through the above-described processing operation, the opening 122 is formed in substantially the center of the base layer 52 in a self-aligned manner. According to the present manufacturing method, the opening 122 can be formed in the center of the base layer 52 by means of the self-alignment technique. Accordingly, misregistration between the position of the base layer 52 and the position of the opening 122 can be made sufficiently small.

Figure 17C:
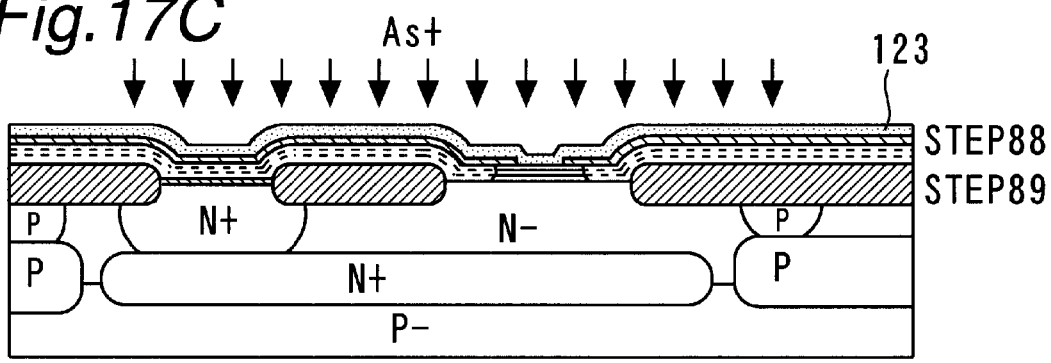

As shown in FIG. 17C, a polycrystalline silicon film 123 is deposited on the entire surface of the semiconductor wafer after removal of the photoresist 120 (step 88).

N-type impurities, such as As, are implanted into the entire surface of the polycrystalline silicon film 123 (step 89).

An oxide film 124 is formed on the polycrystalline silicon film 123 that is doped with n-type impurities (step 90).

Photoresist 126 formed on the oxide film 124 is patterned into the shape of the emitter electrode 28 to be formed (step 91).

Figure 17D:
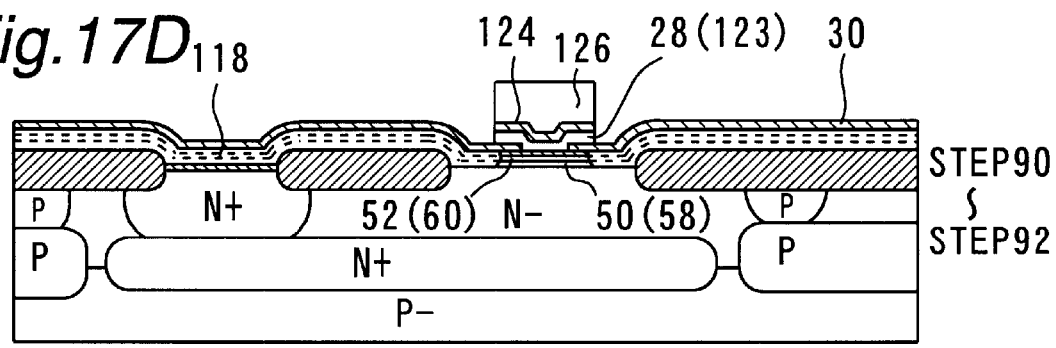

As shown in FIG. 17D, the oxide film 124 and the polycrystalline silicon film 123 are etched while the photoresist 126 is taken as a mask, to thereby form the emitter electrode 28 (step 92).

Figure 18A:
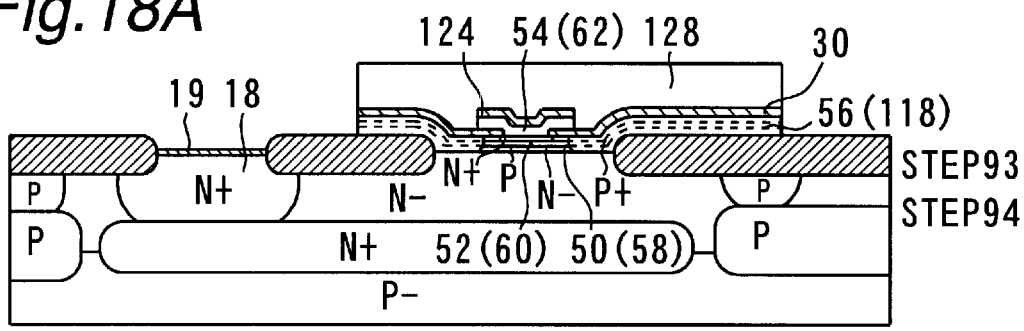

The semiconductor wafer is subjected to predetermined heat treatment, wherewith the impurities (As) contained in the emitter electrode 28 diffuse into the Si epitaxial layer 62 underlying the emitter electrode 28. As shown in FIG. 18A, the emitter layer 54 is formed in substantially the center of the base layer 52 (step 93).

Next, the oxide film 30 and the diffusion layer 118 are etched while photoresist 128, which has been patterned into a desired shape, is used as a mask, thereby forming the base lead electrode 56 (step 94).

Figure 18B:
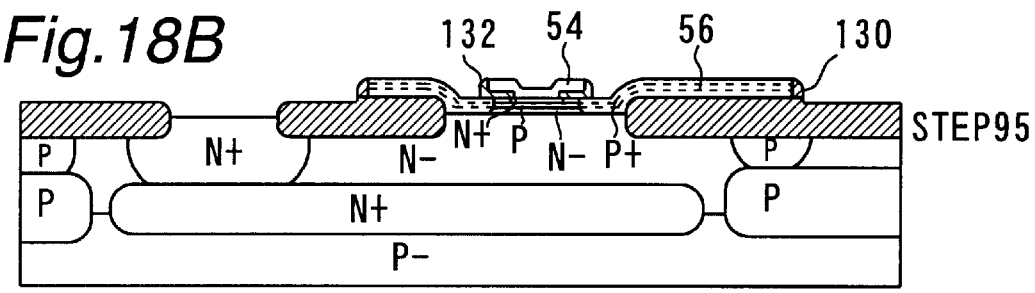

An oxide film is deposited over the entire surface of the semiconductor wafer. The oxide film 30 covering the base lead electrode 56 and the oxide film 123 covering the emitter electrode 54 are etched away together with the oxide film. As shown in FIG. 18B, there are formed a sidewall 130 covering the side surface of the base lead electrode 56 and a side wall 132 covering the side surface of the emitter electrode 54 (step 95).

During the foregoing etching process, the oxide film 19 that covers the n⁺-type collector lead layer 18 is also removed. Consequently, at the end of processing pertaining to step 95, the n⁺-type collector lead layer 18 is also exposed along with the emitter electrode 54 and the base lead electrode 56.

Figure 18C:
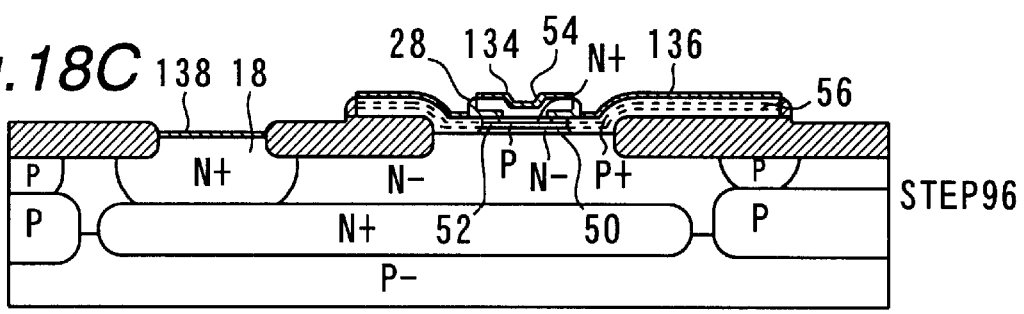

The exposed silicon on the surface of the semiconductor wafer is caused to react with a metal of high melting point, such as Co or Ti. As shown in FIG. 18C, a silicide film 134 is formed on the surface of the emitter electrode 28 in a self-aligned manner. Similarly, a silicide film 136 is formed on the surface of the base lead electrode 56, and a silicide film 138 is formed on the surface of the n+-type collector lead layer 18 (step 96).

Figure 18D:
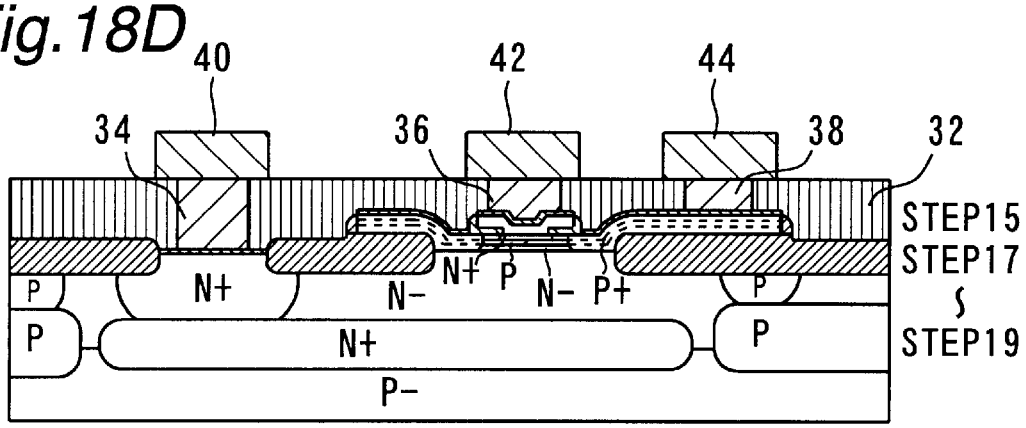

Finally, as shown in FIG. 18D, the dielectric film 32 is deposited over the entire surface of the semiconductor wafer (step 15). Contact holes are formed at appropriate positions (step 17), and the plugs 34, 36, 38 and the metal interconnections 40, 42, and 44 are formed (steps 18 and 19).

As mentioned above, the manufacturing method according to the present embodiment enables formation of the base layer 52 from an epitaxially-grown film. Further, the emitter layer 54, which is smaller than the base layer 52, can be formed in substantially the base layer 52 in a self-aligned manner. Under the manufacturing method according to the present invention, use of an epitaxially-grown film enables formation of the emitter layer 54 in a self-aligned manner in the vicinity of the midpoint inside the base lead electrode 56 while the thickness of the base layer 52 is made sufficiently thin. In this case, the time during which carriers migrate through the base layer 52 is shortened, and base-to-collector capacitance is also diminished.

In the present embodiment, as mentioned previously, the silicide films 134, 136, and 138 are formed on the surface of the base lead electrode 56 and the surface of the emitter electrode 28. In this case, the resistance of a base region of the transistor and the contact resistance of an emitter region are suppressed to sufficiently small values. Accordingly, the manufacturing method according to the present invention enables implementation of a transistor having a considerably superior high-frequency characteristic.

Under the manufacturing method according to the present embodiment, the photoresist 116 formed to cover an area where the base layer 52 is to be formed is isotropically etched, thereby forming the photoresist 116A which covers an area where the emitter layer 54 is to be formed (see FIGS. 16C and 16D). In this case, the photoresist 116A inevitably becomes smaller than the photoresist 116. Therefore, the opening 122 of the oxide film 30 can be formed in substantially the center of the base layer 52 without involvement of advanced machining technology. Thus, the manufacturing method according to the present embodiment enables avoidance of an increase in manufacturing costs.

In the eighth embodiment, the base layer 52 is formed from an SiGe epitaxial layer. However, the present invention is not limited to such a configuration. The base layer 52 may be formed from an epitaxial silicon layer.

Ninth Embodiment

Figure 19A:
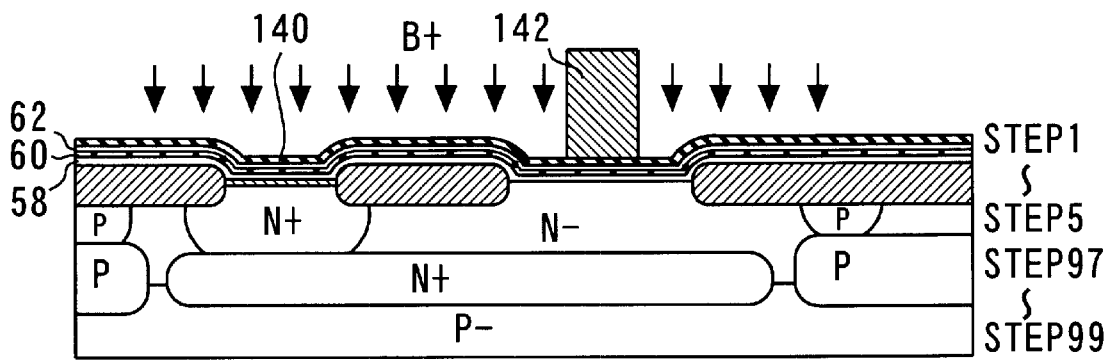
FIGS. 19A to 20D are cross-sectional views for describing a method of manufacturing a bipolar transistor according to a ninth embodiment of the present invention.

A ninth embodiment of the present invention will now be described by reference to FIGS. 19 and 20. As shown in FIG. 19A, the three epitaxial layers 58, 60, and 62 are formed by the same technique as that used in the first embodiment (steps 1 through 5).

A nitride film 140 and an oxide film 142 are deposited on the epitaxial layer 62 (step 97).

The oxide film 142 is patterned so as to cover only the area where an intrinsic layer is to be formed (step 98).

In this state, p-type impurities, such as boron (B), are implanted into the entire surface of the semiconductor wafer. As a result, p-type impurities are implanted into the three epitaxial layers 58, 60, and 62, with the exception of the area where an intrinsic layer is to be formed (step 99).

Figure 19B:
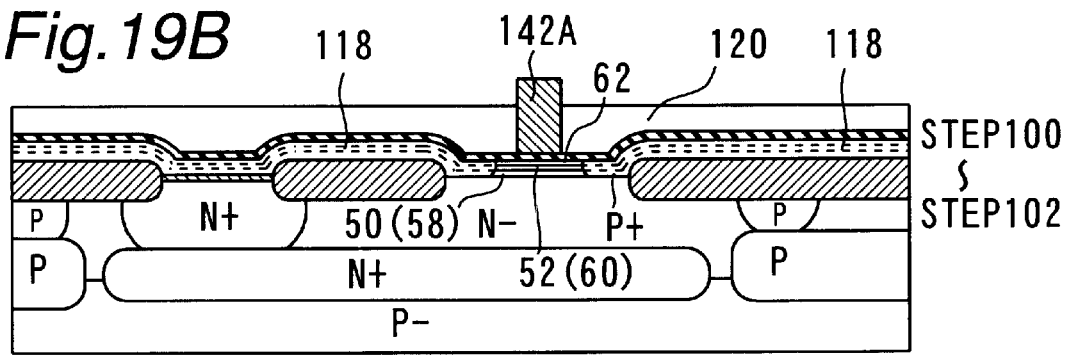

The oxide film 142 is reduced to a predetermined size by means of isotropic etching; that is, to the size of an emitter layer to be formed on the surface of an intrinsic base layer (step 100). The oxide film 142 that has been reduced in size is assigned reference numeral 142A, as shown in FIG. 19B.

The semiconductor wafer is subjected to predetermined heat treatment, as a result of which the impurities (B) implanted in the three epitaxial layers 58, 60, and 62 diffuse, to thereby form a p-type diffusion layer 118 (step 101).

Photoresist 120 is applied to the entire surface of the semiconductor wafer, and the photoresist 120 is etched back until the upper end of the oxide film 142A is exposed (step 102).

Figure 19C:
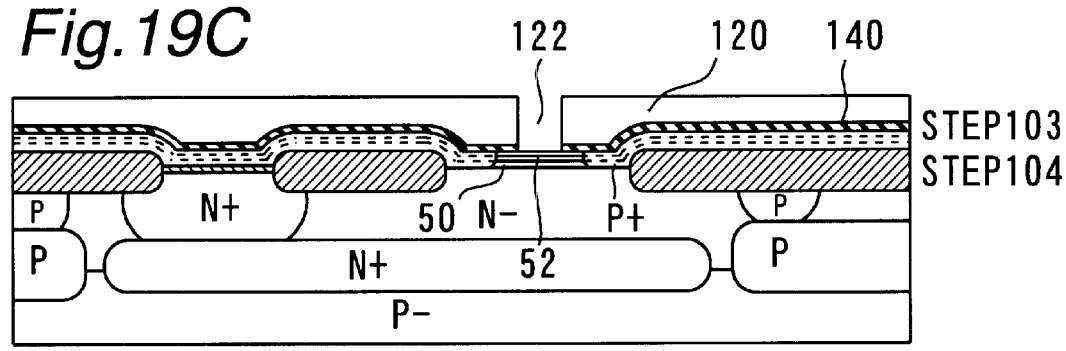

As shown in FIG. 19C, the oxide film 142A that is exposed on the surface of the photoresist 120 is etched away (step 103).

Further, the nitride film 140 is etched while the photoresist 120 is used as a mask, as a result of which the opening 122 is formed in a location where an emitter layer is to be formed (step 104).

Through the above-described processing operation, the opening 122 is formed in substantially the center of the base layer 52 in a self-aligned manner, as in the case of the eighth embodiment. Accordingly, even under the manufacturing method of the present embodiment, misregistration between the position of the base layer 52 and the position of the opening 122 can be made sufficiently small.

After removal of the photoresist 120, the polycrystalline silicon film 123 is deposited on the entire surface of the nitride film 140 (step 105). N-type impurities, such as As, are implanted into the entire surface of the semiconductor substrate (step 106).

A nitride film 144 is formed on the polycrystalline silicon film 123 (step 107).

Figure 19D:
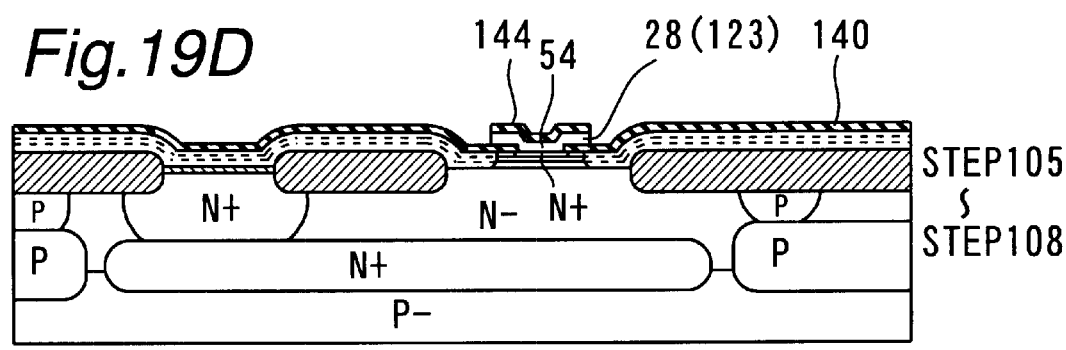

As shown in FIG. 19D, the nitride film 144 and the polycrystalline film 123 are etched into the shape of the emitter electrode 28 (step 108).

Figure 20A:
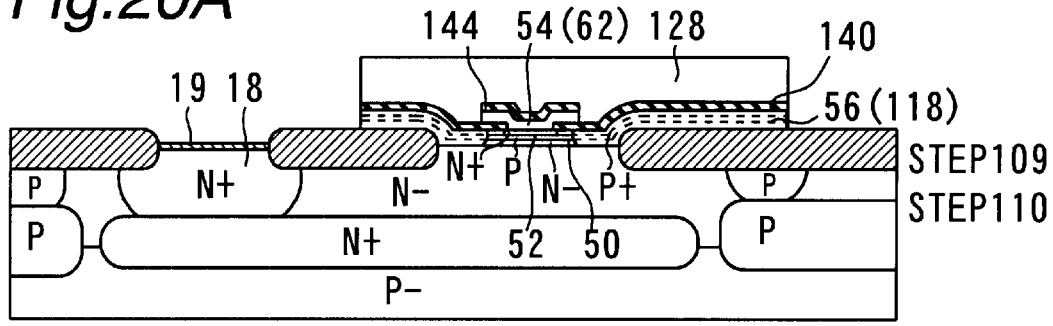

The semiconductor wafer is subjected to predetermined heat treatment, wherewith the impurities (As) contained in the emitter electrode 28 diffuse into the Si epitaxial layer 62 underlying the emitter electrode 28. As shown in FIG. 20A, the emitter layer 54 is formed in substantially the center of the base layer 52 (step 109).

Next, the oxide film 30 and the diffusion layer 118 are etched while the photoresist 128, which has been patterned into a desired shape, is used as a mask, thereby forming the base lead electrode 56 (step 110).

Figure 20B:
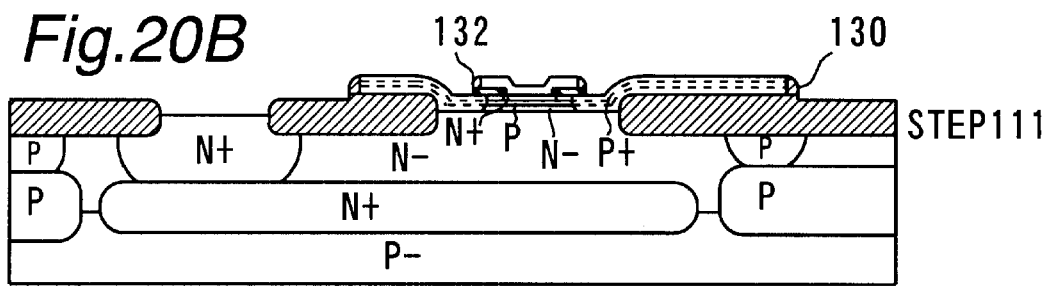

After removal of the oxide film that covers the entire surface of the semiconductor wafer, the nitride film 140 covering the base lead electrode 56 and the nitride 144 covering the emitter electrode 54 are etched away at the same rate together with the oxide film. As shown in FIG. 20B, there are formed the side wall 130 covering the side surface of the base lead electrode 56 and the side wall 132 covering the side surface of the emitter electrode 54 (step 111).

During the foregoing etching process, the oxide film 19 that covers the n+-type collector lead layer 18 is also removed. Consequently, at the end of processing pertaining to step 95, the n+-type collector lead layer 18 is also exposed along with the emitter electrode 54 and the base lead electrode 56.

Figure 20C:
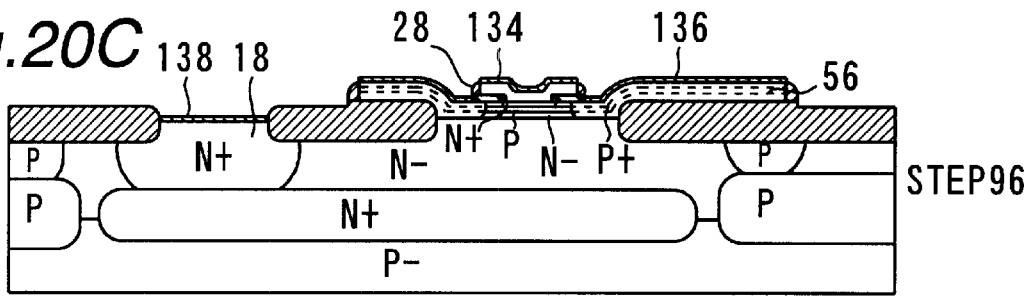
Figure 20D:
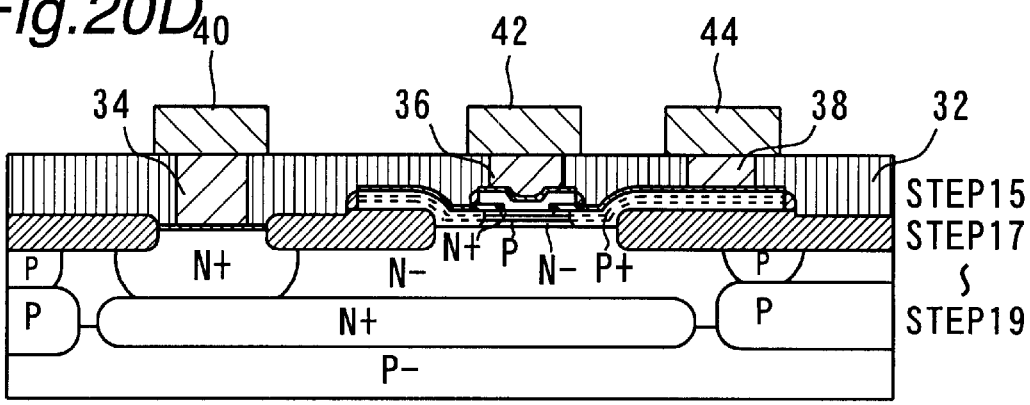

Through a processing operation which is the same as that described in connection with the eighth embodiment, there are formed the silicide films 134, 136, and 138 shown in FIG. 20C (step 96). Further, there are formed the metal interconnections 40, 42, and 44 (steps 15 and 17 through 19).

As mentioned above, as in the case of the eighth embodiment, under manufacturing method according to the ninth embodiment the base layer 52 is formed from an epitaxially-grown film, and the emitter layer 54 is formed in substantially the center of the base layer 52 in a self-aligned manner. In the present embodiment, as mentioned previously, the silicide films 134, 136, and 138 are formed on the surface of the base lead electrode 56 and the surface of the emitter electrode 28. Accordingly, the manufacturing method according to the present invention enables implementation of a transistor having a considerably superior high-frequency characteristic, as in the case of the eighth embodiment.

In the ninth embodiment, the base layer 52 is formed from an SiGe epitaxial layer. However, the present invention is not limited to such a configuration. The base layer 52 may be formed from an epitaxial silicon layer.

Tenth Embodiment

Figure 21A:
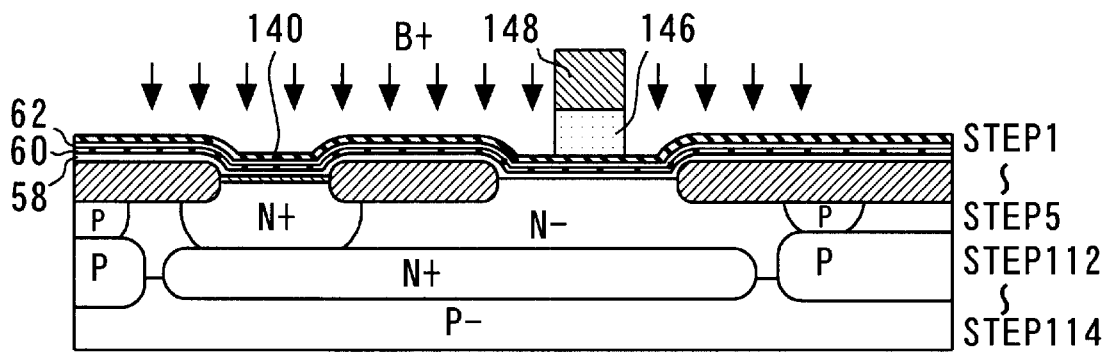
FIGS. 21A to 21D are cross-sectional views for describing a method of manufacturing a bipolar transistor according to a tenth embodiment of the present invention.

A tenth embodiment of the present invention will now be described by reference to FIGS. 21A through 21D. As shown in FIG. 21A, the three epitaxial layers 58, 60, and 62 are formed by the same technique as that used in the first embodiment (steps 1 through 5).

The nitride film 140, a polycrystalline silicon film 146, and an oxide film 148 are deposited on the epitaxial layer 62, in the sequence given (step 112).

The polycrystalline silicon film 146 and the oxide film 148 are patterned so as to cover only the area where an intrinsic layer is to be formed (step 113).

In this state, p-type impurities, such as boron (B), are implanted into the entire surface of the semiconductor wafer.

As a result, p-type impurities are implanted into the three epitaxial layers 58, 60, and 62, with the exception of the area where an intrinsic layer is to be formed (step 114).

The oxide film 148 is reduced to a predetermined size by means of isotropic etching; that is, to the size of an emitter layer to be formed on the surface of an intrinsic base layer (step 115).

By means of anisotropic etching, the polycrystalline silicon film 146 is reduced to a size which is substantially the same as that of the oxide film 148 (step 116).

Figure 21B:
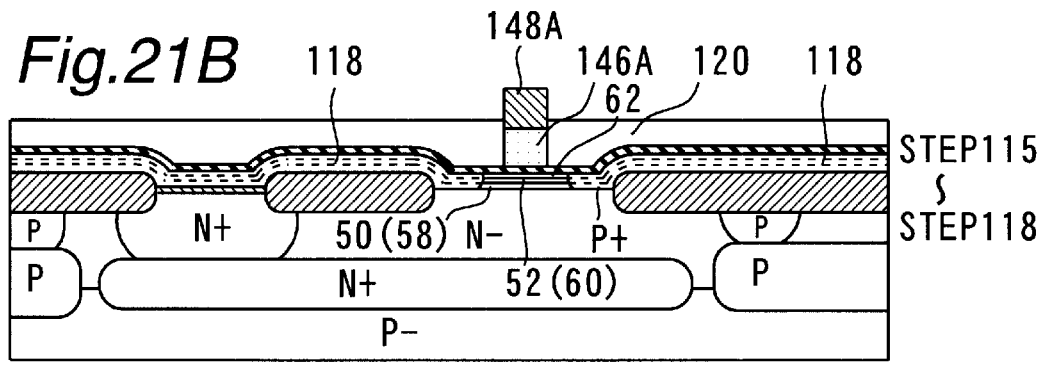

As shown in FIG. 21B, the oxide film 148 that has been reduced in size is assigned reference numeral 148A, and the polycrystalline silicon film 146 that has been reduced in size is assigned reference numeral 146A.

The semiconductor wafer is subjected to predetermined heat treatment, as a result of which the impurities (B) implanted in the three epitaxial layers 58, 60, and 62 diffuse, to thereby form a p-type diffusion layer 118 (step 117).

Photoresist 120 is applied to the entire surface of the semiconductor wafer, and the photoresist 120 is etched back until the upper end of the oxide film 148A is exposed (step 118).

Figure 21C:
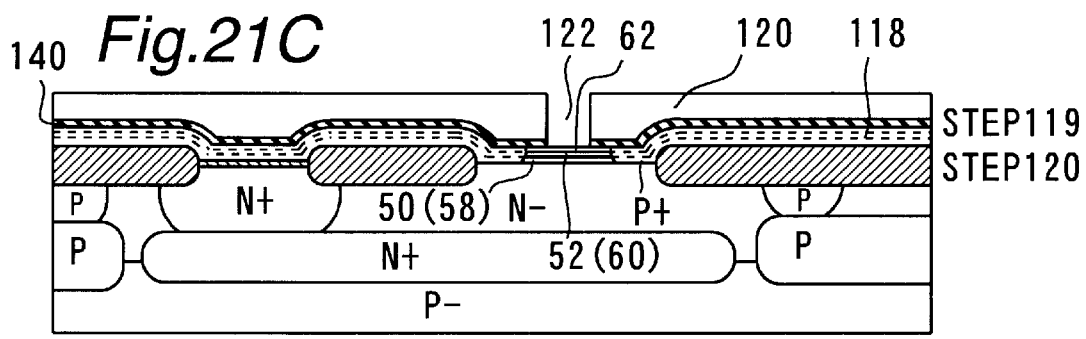

As shown in FIG. 21C, the oxide film 148A and the polycrystalline silicon film 146A, which remain in the photoresist 120, are etched away (step 119).

Further, the nitride film 140 is etched while the photoresist 120 is used as a mask, as a result of which the opening 122 is formed in a location where an emitter layer is to be formed (step 120).

Through the above-described processing operation, the opening 122 is formed in substantially the center of the base layer 52 in a self-aligned manner, as in the case of the eighth or ninth embodiment. Accordingly, even under the manufacturing method of the present embodiment, misregistration between the position of the base layer 52 and the position of the opening 122 can be made sufficiently small.

After removal of the photoresist 120, the polycrystalline silicon film 123 is deposited on the entire surface of the nitride film 140 (step 105). N-type impurities, such as As, are implanted into the entire surface of the semiconductor substrate (step 106).

Figure 21D:
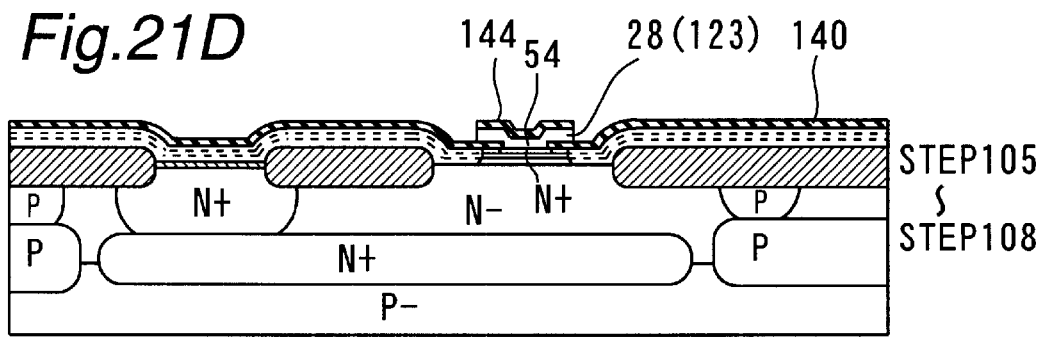

The nitride film 144 is formed on the polycrystalline silicon film 123 (step 107). As shown in FIG. 21D, the nitride film 144 and the polycrystalline film 123 are etched into the shape of the emitter electrode 28 (step 108). Processing operations which are the same as those described in connection with the eighth or ninth embodiment are performed, wherewith fabrication of a bipolar transistor can be completed.

As mentioned above, as in the case of the eighth or ninth embodiment, under manufacturing method according to the present embodiment the base layer 52 is formed from an epitaxially-grown film, and the emitter layer 54 is formed in substantially the center of the base layer 52 in a self-aligned manner. In the present embodiment, as mentioned previously, the silicide films 134, 136, and 138 are formed on the surface of the base lead electrode 56 and the surface of the emitter electrode 28. Accordingly, the manufacturing method according to the present invention enables implementation of a transistor having a considerably superior high-frequency characteristic, as in the case of the eighth or ninth embodiment.

In the previously-described eighth through tenth embodiments, the mask used for implanting p-type impurities into an epitaxial layer is formed from a multilayered film consisting of the polycrystalline silicon film 114 and the photoresist 116, the nitride film 142, or a multilayered film consisting of the polycrystalline silicon film 146 and the oxide film 148. However, the mask is not limited to these films. Any type of mask can be used, so long as the mask can act at the time of implantation of p-type impurities and can eliminate the photoresist 122 at high selectivity.

Eleventh Embodiment

An eleventh embodiment of the present invention will now be described by reference to FIGS. 22A through 22D. According to a manufacturing method of the present embodiment, processing operations up to an operation for implanting p-type impurities, such as As, into the polycrystalline silicon film 123; that is, processing operations pertaining to steps 1 through 6 and those pertaining to steps 81 through 89 shown in FIGS. 16A through 17C, are performed in the same manner as in the eighth embodiment.

Figure 22A:
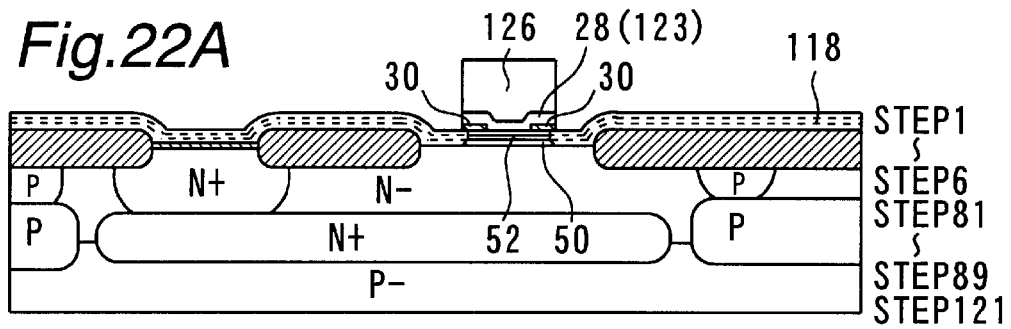
FIGS. 22A to 22D are cross-sectional views for describing a method of manufacturing a bipolar transistor according to a eleventh embodiment of the present invention.

As shown in FIG. 22A, in the present embodiment, the polycrystalline silicon film 123 and the oxide film 30 are etched into the shape of the emitter electrode 28 while the photoresist 126 is taken as a mask (step 121).

As in the case of the eighth through tenth embodiments, the foregoing processing operations enable formation of the emitter electrode 28 in substantially the center of the base layer 52 in a self-aligned manner. Accordingly, even under the manufacturing method according to the present embodiment, the position of the base layer 52 can be accurately matched with the position of the emitter electrode 28.

Figure 22B:
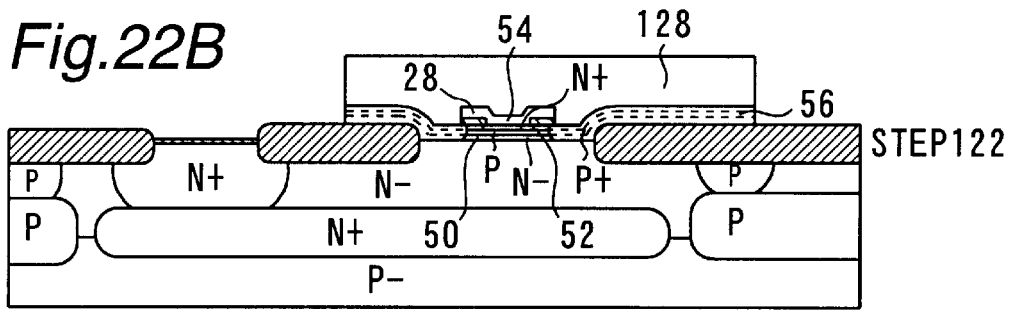

The semiconductor wafer is subjected to predetermined heat treatment, wherewith the impurities (As) contained in the emitter electrode 28 diffuse into the Si epitaxial layer 62 underlying the emitter electrode 28. As shown in FIG. 22B, the emitter layer 54 is formed in substantially the center of the base layer 52 (step 122).

Next, the diffusion layer 118 is etched while the photoresist 128, which has been patterned into a desired shape, is used as a mask, thereby forming the base lead electrode 56 (step 123).

After removal of the photoresist 128, an oxide film is deposited on the entire surface of the semiconductor wafer.

Figure 22C:
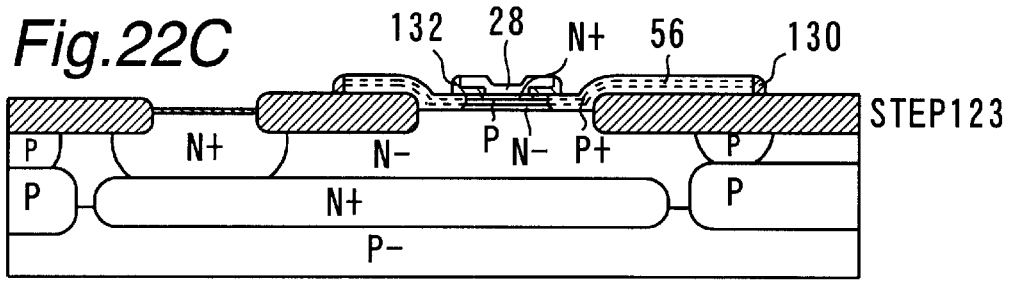

The oxide film is etched until the emitter electrode 28 and the base lead electrode 56 are exposed. As a result, as shown in FIG. 22C, there are formed the side wall 130 covering the side surface of the base lead electrode 56 and the side wall 132 covering the side surface of the emitter electrode 54 (step 123).

During the foregoing etching process, the oxide film 19 that covers the n$^+$-type collector lead layer 18 is also removed. Consequently, at the end of processing pertaining to step 123, the n$^+$-type collector lead layer 18 is also exposed along with the emitter electrode 54 and the base lead electrode 56.

Figure 22D:
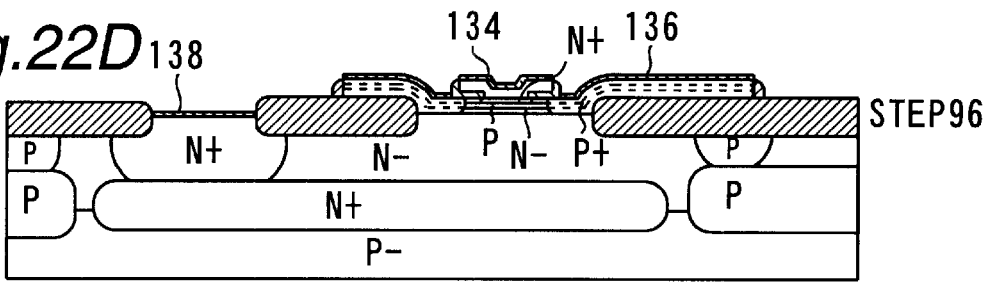

As shown in FIG. 22D, as in the case of the eighth embodiment, the silicide film 134 is formed on the surface of the emitter electrode 28 in a self-aligned manner. Similarly, the silicide film 136 is formed on the surface of the base lead electrode 56, and the silicide film 138 is formed on the surface of the n$^+$-type collector lead layer 18 (step 96). Subsequently, there is performed a processing operation which is the same as that performed in the eighth embodiment, wherewith fabrication of a bipolar transistor is completed.

As mentioned above, as in the case of the eighth through tenth embodiments, under the manufacturing method according to the eleventh embodiment the base layer 52 is formed from an epitaxially-grown film, and the emitter layer 54 is formed in substantially the center of the base layer 52 in a self-aligned manner. In the present embodiment, as mentioned previously, the silicide films 134, 136, and 138 are formed on the surface of the base lead electrode 56 and the surface of the emitter electrode 28. Accordingly, the manufacturing method according to the present invention enables implementation of a transistor having a considerably superior high-frequency characteristic, as in the case of the eighth through tenth embodiments.

The manufacturing method according to the present embodiment enables omission of a process of depositing the oxide film 124 on the emitter electrode 28 (i.e., step 90 in the eighth embodiment) and a process of depositing the nitride film 144 on the emitter electrode 28 (i.e., step 107 in the ninth or tenth embodiment). Therefore, as compared with the eighth through tenth embodiments, the present embodiment can facilitate processes of fabricating a bipolar transistor.

In the eleventh embodiment, in step 121 the oxide film 30 is etched until the diffusion layer 118 is exposed. Alternatively, in step 121 the oxide film 30 may be left to a small amount on the surface of the diffusion layer 118. In this case, in step 123 the residual oxide film 30 can be eliminated at the time of an etching operation for forming the side wall 130. In contrast with the case where the diffusion layer 118 is exposed in step 121, the manufacturing method according to the present invention can diminish the extent to which the diffusion layer 118 is over-etched.

Twelfth Embodiment

Figure 23A:
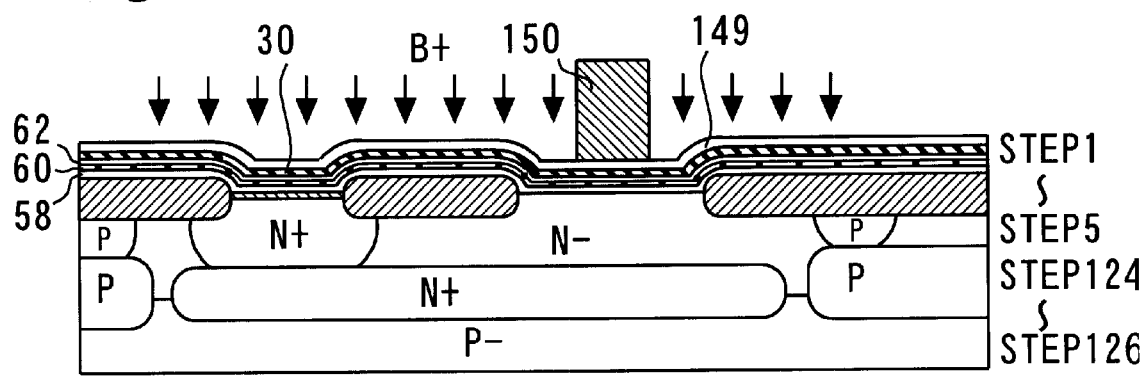
FIGS. 23A to 23D are cross-sectional views for describing a method of manufacturing a bipolar transistor according to a twelfth embodiment of the present invention.

A twelfth embodiment of the present invention will now be described by reference to FIGS. 23A through 23D. As shown in FIG. 23A, under the manufacturing method according to the present embodiment, the three epitaxial layers 58, 60, and 62 are formed by means of the same technique as used in the first embodiment (steps 1 through 5).

The oxide film 30, a first polycrystalline silicon film 149, and the oxide film 150 are deposited on the epitaxial layer 62, in the sequence given (step 124).

Of these films, the oxide film 150 is patterned so as to cover only the area in which an intrinsic base layer is to be formed (step 125).

In this state, p-type impurities, such as boron (B), are implanted into the entire surface of the semiconductor wafer. As a result, p-type impurities are implanted into the three epitaxial layers 58, 60, and 62, with the exception of the area where an intrinsic base layer is to be formed (step 126).

Figure 23B:
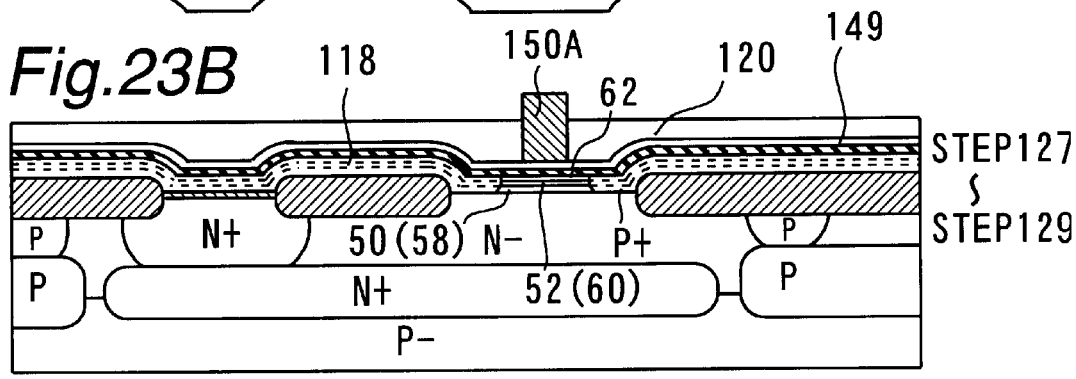

The oxide film 150 is reduced in size to a specific size by means of isotropic etching; that is, to the dimension of an emitter layer which is to be formed on the surface of an intrinsic base layer (step 127). As shown in FIG. 23B, the oxide film 150 that has been reduced in size is designated by 150A.

The semiconductor wafer is subjected to predetermined heat treatment, wherewith the impurities (B) contained in the three epitaxial layers 58, 60, and 62 diffuse, thus forming the p-type diffusion layer 118 (step 128).

The photoresist 120 is applied to the entire surface of the semiconductor wafer. The photoresist 120 is etched back until the upper end of the polycrystalline silicon film 114A is exposed (step 129).

Figure 23C:
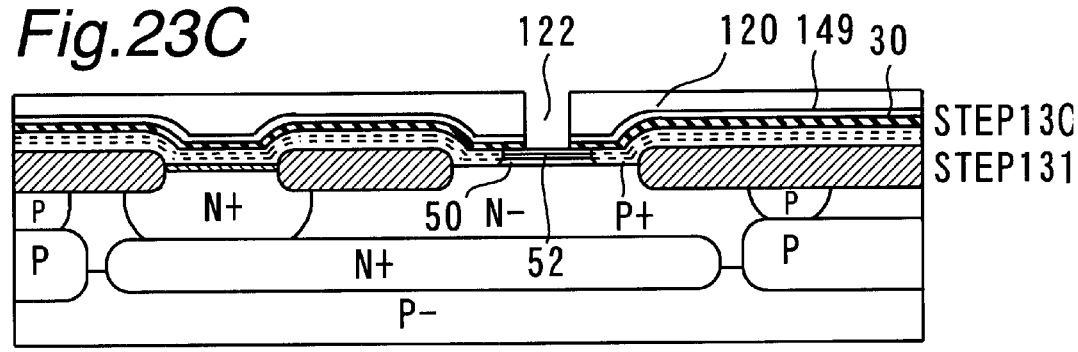
Figure 23D:
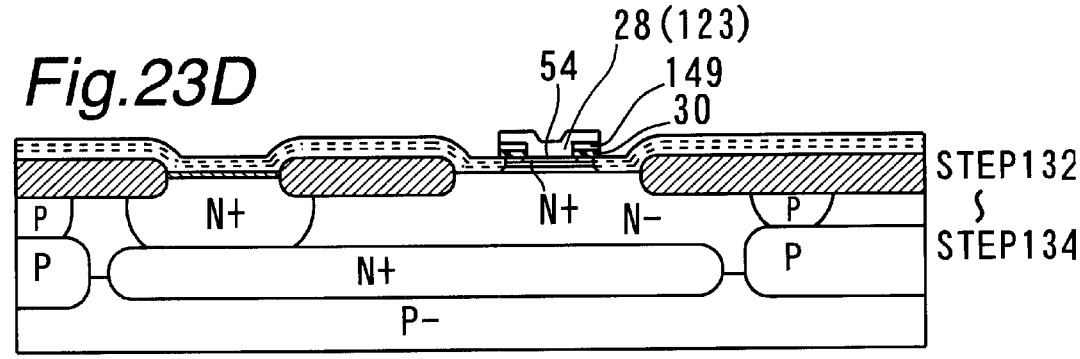

As shown in FIG. 23C, the oxide film 150A that remains in the photoresist 120 is etched away (step 130).

Further, the first polycrystalline silicon film 149 and the oxide film 30 are etched while the photoresist 120 is used as a mask, as a result of which the opening 122 is formed at a location where an emitter layer is to be formed (step 131).

As in the case of the eighth through tenth embodiments, through the above-described processing operation, the opening 122 is formed in substantially the center of the base layer 52 in a self-aligned manner. Accordingly, even under the manufacturing method of the present embodiment, misregistration between the position of the base layer 52 and the position of the opening 122 can be made sufficiently small.

After removal of the photoresist 120, the polycrystalline silicon film 123 (i.e., a second polycrystalline silicon film) is deposited on the polycrystalline silicon film 149 (i.e., a first polycrystalline silicon film), and n-type impurities, such as As, are implanted into the semiconductor substrate (step 132).

The semiconductor wafer is subjected to predetermined heat treatment, whereby the impurities (As) contained in the second polycrystalline silicon film 123 diffuse into the Si epitaxial layer 62 underlying the second polycrystalline silicon film 123. The emitter layer 54 is then formed in substantially the center of the base layer 52 (step 133).

The second polycrystalline silicon film 123, the first polycrystalline silicon film 149, and the oxide film 30 are etched into the shape of the emitter electrode 28 while photoresist is taken as a mask (step 134). There is performed the same processing operation as performed in the eleventh embodiment, thus completing fabrication of a bipolar transistor.

Under the manufacturing method according to the twelfth embodiment, a first mask required to be reduced in size can be formed from fewer materials than those used in the tenth embodiment. Specifically, the first mask can be formed from only one type of material. In contrast with a case where a first mask formed from a plurality of materials is etched, a first mask formed from one type of material is more easily etched. Accordingly, as compared with the manufacturing method of the tenth embodiment, the manufacturing method of the present embodiment can facilitate processes for fabricating a transistor.

The major benefits of the present invention described above are summarized as follows:

According to the first aspect of the present invention, an HBT capable of being manufactured through simple steps is realized.

According to the second aspect of the present invention, since the surface of a collector lead layer is covered with a collector electrode, there can be diminished the amount of overetching required for forming contact holes for a collector region, a base region, and an emitter region. Thus, the present invention renders the quality of an HBT stable.

According to the third aspect of the present invention, a silicide layer is formed on the surface of an emitter electrode, as well as on the surfaces of base lead electrodes. Therefore, the present invention enables a sufficient reduction in the resistance of the base region of the HBT and the resistance of interconnections.

According to the fourth aspect of the present invention, the impurity concentration of a first-type epitaxial silicon layer assumes a profile such that concentration becomes high in the vicinity of a boundary region between the first-type epitaxial silicon layer and a second-type SiGe epitaxial layer and becomes lower in the vicinity of a boundary region between the first-type epitaxial silicon layer and a first silicon layer. More specifically, a sub-collector layer contains a high concentration of first impurities in the vicinity of a boundary region between the sub-collector layer and the base layer and a low concentration of first impurities in the vicinity of a boundary region between the sub-collector layer and the silicon substrate. Therefore, the present invention ensures a high withstand voltage while preventing occurrence of a base spreading effect, which would otherwise be caused when the HBT operates at high frequency.

According to the fifth aspect of the present invention, there can be manufactured an HBT comprising an emitter layer based on a silicon epitaxial layer and a base layer based on an SiGe epitaxial layer through simple manufacturing steps.

According to the sixth aspect of the present invention, there can be formed contact holes corresponding to collector, base, and emitter while the surface of the collector lead layer is coated with a collector electrode. Therefore, the present invention enables manufacture of an HBT having stable quality.

According to the seventh aspect of the present invention, oxide films having substantially the same thickness are formed on the emitter electrode and on the second-type silicon epitaxial layer, before the oxide films are removed by an anisotropic etching. In this case, a sidewall can be formed on the side surface of the emitter electrode without involvement of excessive overetching of the surface of the emitter electrode and the second-type silicon epitaxial layer. Further, according to the present invention, a silicide layer can be formed on the surface of the emitter electrode as well as on the surface of the second-type silicon epitaxial layer, through use of the sidewall and without involvement of occurrence of a short circuit therebetween. Accordingly, the present invention enables high-yield and easy manufacture of an HBT having low resistance of the base region and low resistance of interconnections.

According to the eighth aspect of the present invention, through simple steps there can be readily manufactured, an HBT comprising a sub-collector layer doped with first impurities at a profile that shows a high concentration in the vicinity of a boundary region between the sub-collector layer and the base layer and a low concentration in the vicinity of a boundary region between the sub-collector layer and the silicon substrate. The present invention enables manufacture, through simple steps, of an HBT having a high withstand voltage and being capable of preventing a base spreading effect, which would otherwise be caused when the HBT operates at high frequency.

According to the ninth aspect of the present invention, a first mask is reduced in size after an impurity of first conductive type is implanted into a first conductive layer. Then, an impurity of second conductive type is introduced into the first conductive layer through use of an opening which has a size same as that of the reduced first mask. In such a case, the impurity of the second conductive type is always introduced into an area locating almost at the center of the region to which no impurity of the first conductive type is implanted. The present invention, therefore, forms an emitter layer at the vicinity of the center of an intrinsic base layer in a self-aligned manner.

According to the tenth aspect of the present invention, an impurity diffuses from the second conductive layer into the first conductive layer through the opening. Thus, the impurity is implanted into the first conductive layer at a portion thereof lying right under the opening.

Preferably, a silicide layer can be formed on the surface of the first conductive layer and the surface of the second conductive layer. According to the present invention, an electrode involving small resistance or an interconnection construction can be embodied on the basis of the first conductive layer, the second conductive layer, and a silicide layer formed thereon.

Preferably, a multilayered film formed from an Si epitaxial layer, an SiGe epitaxial layer, and an Si epitaxial layer can be used as a first conductive layer. In this case, the SiGe epitaxial layer is taken as a base layer, and an Si epitaxial layer laid on the SiGe epitaxial layer is taken as an emitter layer. Thus, the thicknesses of the respective layers can be readily and accurately controlled.

Since the material of the first insulation film and the material of the first mask are combined appropriately, an etching operation for patterning or scaling down the first mask or an etching operation for forming an opening in the first mask can be performed appropriately.

According to another aspect of the present invention, a desired processing operation can be readily realized by means of utilization of photoresist as a second mask.

Preferably, the second conductive film can be taken as a stopper for preventing etching of the first mask and can be used as a portion of an emitter electrode. According to the present invention, an etching operation for patterning or scaling down the material of the first mask can be facilitated.

Further, the present invention is not limited to these embodiments, but variations and modifications may be made without departing from the scope of the present invention.

The entire disclosure of Japanese Patent Application No. 2000-2429 filed on Jan. 11, 2000 as well as Japanese Patent Application No. 2000-182809 filed on Jun. 19, 2000 each including specification, claims, drawings and summary are incorporated herein by reference in its entirety.

What is claimed is:

1. A bipolar transistor comprising:
   a first-type silicon layer formed on the surface of a silicon substrate so as to contain impurities of first conductivity type;
   a first-type silicon epitaxial layer formed directly on the first-type silicon layer so as to contain impurities of first conductivity type;
   a second-type SiGe epitaxial layer which contains impurities of second conductivity type at a first concentration and is formed directly on the first-type silicon epitaxial layer so as to contain germanium at a predetermined concentration profile, and
   a second-type silicon epitaxial layer formed directly on the second-type SiGe epitaxial layer so as to contain impurities of second conductivity type at a second concentration lower than the first concentration, wherein the germanium content in the second-type SiGe epitaxial layer becomes higher in the vicinity of a boundary region between the second-type SiGe epitaxial layer and the first-type silicon epitaxial layer than in a boundary region between the second-type SiGe epitaxial layer and the second-type silicon epitaxial layer.

2. The bipolar transistor according to claim 1, further comprising an emitter electrode made of polycrystalline silicon that covers a predetermined portion of the three layered epitaxial layers;

wherein the portion of the second-type silicon epitaxial layer covered with the emitter electrode corresponds to an emitter layer adjusted to a semiconductor of first conductivity type;

wherein the portion of the second SiGe epitaxial layer which remains in contact with the emitter layer corresponds to a base layer adjusted to a semiconductor of second conductivity type;

wherein the portion of the first-type silicon epitaxial layer which remains in contact with the base layer corresponds to a sub-collector region adjusted to a semiconductor of first conductivity type; and wherein portions of the three layered epitaxial layers which are not covered with the emitter electrode correspond to base lead electrodes adjusted to a semiconductor of second conductivity type.

3. The bipolar transistor according to claim 2, further comprising:

a collector lead layer formed in the area of the first-type silicon layer which is not covered with the base lead electrodes;

a collector electrode formed on the collector lead layer;

an insulating film formed on the emitter electrode, the base lead electrode, and the collector electrode; and conductive plugs formed in the insulating film so as to come into contact with the emitter electrode, the base lead electrode, and the collector electrode, respectively.

4. The bipolar transistor according to claim 2, wherein a silicide layer is provided on the surface of the emitter electrode, as well as on the surfaces of the base lead electrodes.

5. The bipolar transistor according to claim 2, wherein the concentration of impurities of first type within the first-type silicon epitaxial layer becomes higher in the vicinity of a boundary region between the first-type silicon epitaxial layer and the second-type SiGe epitaxial layer than in a boundary region between the first-type silicon epitaxial layer and the first-type silicon layer.

* * * * *